US012748147B2

(12) United States Patent
Buxkemper et al.

(10) Patent No.: US 12,748,147 B2
(45) Date of Patent: Sep. 29, 2026

(54) CLOUD-BASED LINE DIFFERENTIAL RELAYS DYNAMIC TESTING

(71) Applicant: AVO Multi-Amp Corporation, Dallas, TX (US)

(72) Inventors: Bruce Buxkemper, Dallas, TX (US); Dhanabal Mani, Dallas, TX (US); Brandon McGallion, College Station, TX (US); Brian Douglas Brittain, College Station, TX (US)

(73) Assignee: AVO Multi-Amp Corporation, Dallas, TX (US)

( * ) Notice: Subject to any disclaimer, the term of this patent is extended or adjusted under 35 U.S.C. 154(b) by 152 days.

(21) Appl. No.: 18/921,917

(22) Filed: Oct. 21, 2024

(65) Prior Publication Data

US 2025/0130281 A1 Apr. 24, 2025

Related U.S. Application Data

(60) Provisional application No. 63/592,349, filed on Oct. 23, 2023.

(51) Int. Cl.
*G01R 31/327* (2006.01)

(52) U.S. Cl.
CPC ................................ *G01R 31/3278* (2013.01)

(58) Field of Classification Search
USPC ........................................................ 324/418
See application file for complete search history.

(56) References Cited

U.S. PATENT DOCUMENTS

| | | | | |
|---|---|---|---|---|
| 6,396,279 | B1 | 5/2002 | Gruenert | |
| 2010/0241902 | A1 * | 9/2010 | Gilbertson | G01R 31/3274 714/33 |

FOREIGN PATENT DOCUMENTS

| | | | |
|---|---|---|---|
| CN | 104897981 | A | 9/2015 |
| CN | 115327290 | A | 11/2022 |
| JP | 2008070177 | A | 3/2008 |

OTHER PUBLICATIONS

Kuber, Sughosh R., et al.; "End-to-End Dynamic Testing Methodology for Validation of Line Differential Protection—Test Considerations and Challenges"; CIGRE-423; 2021 CIGRE Canada Conference; Toronto, Ontario; Oct. 25-28, 2021; 9 pages.

(Continued)

*Primary Examiner* — Farhana A Hoque
(74) *Attorney, Agent, or Firm* — Conley Rose, P.C.; J. Robert Brown, Jr.

(57) ABSTRACT

A cloud-based line differential relay testing includes establishing, by a local relay test system, communication with a server, wherein the local relay test system comprises a local relay test unit connected to a local relay of a transmission line, providing a user interface for enabling the local relay test system to initiate line differential relay testing on both the local relay and a remote relay; receiving line differential relay test parameter values for performing a sequence of line differential relay protection tests on the local relay and the remote relay; sending, to a remote relay test system with the by way of the server, a command for performing the sequence of line differential relay tests based on the line differential relay test parameter values; and performing, by the local relay test system, the sequence of line differential relay protection tests based on the line differential relay test parameter values.

20 Claims, 15 Drawing Sheets

(56) References Cited

OTHER PUBLICATIONS

PCT International Search Report and PCT Written Opinion of the International Searching Authority; Application No. PCT/US2024/052237; Feb. 3, 2025; 9 pages.

Benmouyal, Gabriel; "The Trajectories of Line Current Differential Faults in the Alpha Plane"; 32nd Annual Eastern Protective Relay Conference; Oct. 2005; 17 pages.

Kasztenny, Bogdan, et al.; "Tutorial on Operating Characteristics of Microprocessor-Based Multiterminal Line Current Differential Relays"; 38th Annual Western Protective Relay Conference; Oct. 2011; 31 pages.

Kuber, Sughosh, et al.; "PTP & Non-PTP Based End-to-End Dynamic Testing Methodology for Validation of Line Differential Protection—Test Consideration and Challenges"; 75th Annual Conference for Protective Relay Engineers (CPRE); Mar. 28-31, 2022; 2 pages.

Rudd, Adam, et al.; "System Based Testing of a 72 kV Line Protection Scheme at EPCOR"; Omicron; Canada Protection Symposium; 2017; 11 pages.

Zimmerman, Karl, et al.; "A Practical Approach to Line Current Differential Testing"; 66th Annual Conference for Protective Relay Engineers Apr. 2013; 12 pages.

* cited by examiner

1000

| Phase | Injected Current (Secondary) | | | | Currents Observed From Relay | | | | | |
|---|---|---|---|---|---|---|---|---|---|---|
| | Local | | Remote | | Local | | Remote | | Ibias | Idiff |
| | I (A) | φ (°) | I (A) | φ (°) | I (A) | φ (°) | I (A) | φ (°) | | |
| A | 5.000 | 0 | 5.000 | 180 | 5.01 | -0.1 | 5.01 | 179.9 | 0.01 | 0 |
| B | 5.000 | -120 | 5.000 | 60 | 5.01 | -120 | 4.98 | 60 | 0 | 0 |
| C | 5.000 | 120 | 5.000 | -60 | 5 | 120 | 4.99 | -60.1 | 0 | 0 |

Stabilization Test Passed

Pickup Test - Local

| Phase Tested | Pickup Setting pu | Pickup pu | Pickup (A) | Error (%) | ✓/X |
|---|---|---|---|---|---|
| A | 1.200 | 1.200 | 6.000 | 0.00 | ✓ |
| B | 1.200 | 1.200 | 6.000 | 0.00 | ✓ |
| C | 1.200 | 1.200 | 6.000 | 0.00 | ✓ |
| ABC | 1.200 | 1.200 | 6.000 | 0.00 | ✓ |

Pickup Test - Remote

| Phase Tested | Pickup Setting pu | Pickup pu | Pickup (A) | Error (%) | ✓/X |
|---|---|---|---|---|---|
| A | 1.200 | 1.200 | 6.000 | 0.00 | ✓ |
| B | 1.200 | 1.200 | 6.000 | 0.00 | ✓ |
| C | 1.200 | 1.200 | 6.000 | 0.00 | ✓ |
| ABC | 1.200 | 1.200 | 6.000 | 0.00 | ✓ |

Timing Test - Local

| Phase Tested | Fault Current (% Ib) | Expected Trip Time (s) | Maximum Trip Time (s) | Measured Trip Time (s) | Error (%) | ✓/X |
|---|---|---|---|---|---|---|
| A | 100 | 0.04 | 0.05 | 0.039 | -2.50 | ✓ |
| B | 100 | 0.04 | 0.05 | 0.041 | +2.50 | ✓ |
| C | 100 | 0.04 | 0.05 | 0.039 | -2.50 | ✓ |
| ABC | 100 | 0.04 | 0.05 | 0.039 | 0.00 | ✓ |

FIG. 12A

Timing Test - Remote

| Phase Tested | Fault Current (% Ib) | Expected Trip Time (s) | Maximum Trip Time (s) | Measured Trip Time (s) | Error (%) | ✓/X |
|---|---|---|---|---|---|---|
| A | 100 | 0.04 | 0.05 | 0.038 | -5.00 | ✓ |
| B | 100 | 0.04 | 0.05 | 0.041 | +2.50 | ✓ |
| C | 100 | 0.04 | 0.05 | 0.039 | -2.50 | ✓ |
| ABC | 100 | 0.04 | 0.05 | 0.040 | 0.00 | ✓ |

FIG. 12B

| # | Ibias (pu) | Expected Idiff (pu) | Idiff (pu) | Local (A) | Remote (A) | Error (%) | ✓/X | |
|---|---|---|---|---|---|---|---|---|
| 1 | 1.6 | 0.400 | 0.392 | 0.608 | 0.369 | -2.00 | ✓ | ... |
| 2 | 2.4 | 0.600 | 0.600 | 0.916 | 0.549 | 0.00 | ✓ | ... |
| 3 | 4.3 | 1.445 | 1.431 | 1.749 | 0.876 | -1.00 | ✓ | ... |
| 4 | 7.7 | 3.145 | 3.051 | 3.281 | 1.419 | -3.00 | ✓ | ... |
| 5 | 12.4 | 5.495 | 5.330 | 5.411 | 2.158 | -3.00 | ✓ | ... |
| 6 | 16 | 7.295 | 7.076 | 7.042 | 2.723 | -3.00 | ✓ | ... |
| 7 | 19.6 | 8.000 | 7.840 | 8.374 | 3.589 | -2.00 | ✓ | ... |

| LOCAL | | REMOTE | |
|---|---|---|---|
| A | 8.374@0.00 | A | 3.589@180.00 |
| B | 8.374@120.00 | B | 3.589@300.00 |
| C | 8.374@240.00 | C | 3.589@60.00 |

CLOUD-BASED LINE DIFFERENTIAL RELAYS DYNAMIC TESTING

CROSS-REFERENCE TO RELATED APPLICATIONS

This application claims priority to provisional application 63/592,349 filed on Oct. 23, 2023, which is hereby incorporated by reference in its entirety.

BACKGROUND

Line differential protection is one of the most popular forms of transmission line protection. This type of protection is based on Kirchoff's current law (KCL), which states that the current flowing into a line must be equal to the current flowing out of the line. With line differential protection, the zone of protection is defined by the location of the current transformers (CTs) monitoring the currents at each end of the line. When a fault occurs, it is essential for the protective relays at the ends of the line to communicate with each other and issue a trip signal for in-zone faults.

SUMMARY

A first aspect relates to a cloud-based line differential relay protection testing method implemented by a server. The method includes establishing a first connection to a first relay test system, wherein the first relay test system is located at a first location and comprises a first relay test unit connected to a first relay that is connected to a transmission line at the first location; establishing a second connection to a second relay test system, wherein the second relay test system is located at a second location and comprises a second relay test unit connected to a second relay that is connected to the transmission line at the second location; creating a daisy-chain connection between the first relay test system and the second relay test system for exchanging messages between the first relay test system and the second relay test system; receiving, from the first relay test system, a line differential relay protection test command comprising test parameter values; sending, to the second relay test system, the line differential relay protection test command; receiving, from the second relay test system, a result of a line differential relay protection test performed on the transmission line based on the line differential relay protection test command; and sending, to the first relay test system, the result of the line differential relay protection test.

Optionally, in a first implementation according to the first aspect, the method further includes receiving, from the first relay test system, first authentication information; receiving, from the second relay test system, second authentication information; and authenticating, prior to creating the daisy-chain connection, the first relay test system and the second relay test system based on the first authentication information and the second authentication information.

Optionally, in a second implementation according to the first aspect or any implementation thereof, authenticating the first relay test system and the second relay test system comprises determining that the first authentication information and the second authentication information comprises a matching password.

Optionally, in a third implementation according to the first aspect or any implementation thereof, the second relay test system is a remote relay test system, and wherein the second connection is established prior to the first connection.

Optionally, in a fourth implementation according to the first aspect or any implementation thereof, the method further includes terminating the daisy-chain connection in response to receiving a termination request from either the first relay test system or the second relay test system.

A second aspect relates to a cloud-based line differential relay testing method implemented by a local relay test system. The method includes establishing, by the local relay test system, communication with a server, wherein the local relay test system comprises a local relay test unit connected to a local relay of a transmission line; sending, to the server, authentication information of the local relay test system; providing a user interface for enabling the local relay test system to initiate a sequence of line differential relay protection tests on both the local relay and a remote relay; receiving line differential relay protection test parameter values for performing a sequence of line differential relay protection tests on the local relay and the remote relay; receiving a command to perform the sequence of differential relay protection tests based on the line differential relay protection test parameter values; sending, to a remote relay test system by way of the server, the command for performing the sequence of line differential relay protection tests based on the line differential relay protection test parameter values; and performing, by the local relay test system, the sequence of line differential relay protection tests based on the line differential relay protection test parameter values.

Optionally, in a first implementation according to the second aspect, the method further includes receiving, from the remote relay test system by way of the server, results of the sequence of line differential relay protection tests performed by the remote relay test system.

Optionally, in a second implementation according to the second aspect or any implementation thereof, the method further includes obtaining a time reference signal.

Optionally, in a third implementation according to the second aspect or any implementation thereof, the line differential relay protection test parameter values indicates a start time based on the time reference signal.

Optionally, in a fourth implementation according to the second aspect or any implementation thereof, the method further includes initiating, simultaneously with the remote relay test system, the sequence of line differential relay protection tests at the start time.

Optionally, in a fifth implementation according to the second aspect or any implementation thereof, the method further includes sending the command to a port of the server designated for sending messages to the remote relay test system.

Optionally, in a sixth implementation according to the second aspect or any implementation thereof, the sequence of line differential relay protection tests simulates prefault and fault conditions.

Optionally, in a seventh implementation according to the second aspect or any implementation thereof, the method further includes sequentially performing, without user-interaction, the sequence of line differential relay protection tests based on the line differential relay protection test parameter values.

Optionally, in an eight implementation according to the second aspect or any implementation thereof, the sequence of line differential relay protection tests comprises a stabilization test, a pickup test, a timing test, and a characteristic test.

Optionally, in a ninth implementation according to the second aspect or any implementation thereof, the characteristic test comprises a percent differential search test, a percent differential shot test, an alpha plane search test, and an alpha plane shot test.

Optionally, in a tenth implementation according to the second aspect or any implementation thereof, the method further configuring the local relay test system to switch from the local relay test system to the remote relay test system.

A third aspect relates to a cloud-based line differential relay testing method implemented by a remote relay test system. The method includes establishing, by the remote relay test system, communication with a server, wherein the remote relay test system comprises a remote relay test unit connected to a remote relay of a transmission line; sending, to the server, authentication information of the remote relay test system; receiving, from a local relay test system by way of the server, a command to perform a sequence of line differential relay protection tests, wherein the command comprises line differential relay test parameter values for performing the sequence of differential relay protection tests relay; performing, by the local relay test system, the sequence of line differential relay protection tests based on the line differential relay test parameter values; and sending, to local relay test system by way of the server, a result of the sequence of line differential relay protection tests.

Optionally, in a first implementation according to the third aspect, the method further includes obtaining a time based on a timing signal; obtaining a start time from the line differential relay test parameter values; and synchronizing performing the sequence of line differential relay protection tests with the local relay test system based on the time and the start time.

Optionally, in a second implementation according to the third aspect or any implementation thereof, the method further includes sequentially performing, without user-interaction, the sequence of line differential relay protection tests based on the line differential relay test parameter values, and wherein the sequence of line differential relay protection tests sequence of tests comprises a stabilization test, a pickup test, a timing test, and a characteristic test.

Optionally, in a third implementation according to the third aspect or any implementation thereof, the characteristic test comprises a percent differential search test, a percent differential shot test, an alpha plane search test, and an alpha plane shot test.

A fourth aspect relates to an apparatus comprising a memory configured to store instructions; and one or more processors coupled to the memory and configured to execute the instructions to cause the apparatus to perform the method according to the first aspect or any implementation thereof.

A fifth aspect relates to an apparatus comprising a memory configured to store instructions; and one or more processors coupled to the memory and configured to execute the instructions to cause the apparatus to perform the method according to the second aspect or any implementation thereof.

A sixth aspect relates to an apparatus comprising a memory configured to store instructions; and one or more processors coupled to the memory and configured to execute the instructions to cause the apparatus to perform the method according to the third aspect or any implementation thereof.

A seventh aspect relates to a computer program product comprising computer-executable instructions stored on a non-transitory computer-readable storage medium, the computer-executable instructions when executed by one or more processors of an apparatus, cause the apparatus to perform the method according to the first aspect or any implementation thereof.

An eighth aspect relates to a computer program product comprising computer-executable instructions stored on a non-transitory computer-readable storage medium, the computer-executable instructions when executed by one or more processors of an apparatus, cause the apparatus to perform the method according to the second aspect or any implementation thereof.

A ninth aspect relates to a computer program product comprising computer-executable instructions stored on a non-transitory computer-readable storage medium, the computer-executable instructions when executed by one or more processors of an apparatus, cause the apparatus to perform the method according to the third aspect or any implementation thereof.

BRIEF DESCRIPTION OF DRAWINGS

FIG. 12A and FIG. 12B are diagrams of a user interface depicting the results of a relay timing test in accordance with the disclosed embodiments.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

Described herein is a system and method for cloud-based line differential relays dynamic testing. Embodiments of the present disclosure enable centralized control of line differential relays dynamic testing by a single operator from only one end of the line, enhancing efficiency and reducing skilled manpower requirements. The disclosed embodiments include a flexible testing software that allows for comprehensive pickup and timing tests along the entire line differential characteristics, such as an alpha plane or slope percent differential. The disclosed embodiments are less prone to operational errors because all configuration and loading of test cases is performed only at one end. In certain embodiments, test sets are connected to a cloud server managed by either the test set manufacturer, the testing company, or the asset owner. In some embodiments, global positioning system (GPS) based Inter-Range Instrument Group-B (IRIG-B) timing reference may be used for synchronization during the test for precise timing across disparate locations, ensuring high accuracy in test signal injections and fault simulations. The disclosed embodiments enable a battery of tests to be performed including stabilization verification, internal and external faults, and static and dynamic tests using state sequences and dynamic searches. Additionally, the disclosed cloud-based platform enables real-time data sharing and analysis, allowing for immediate troubleshooting and enhanced collaborative efforts.

Figure 1:
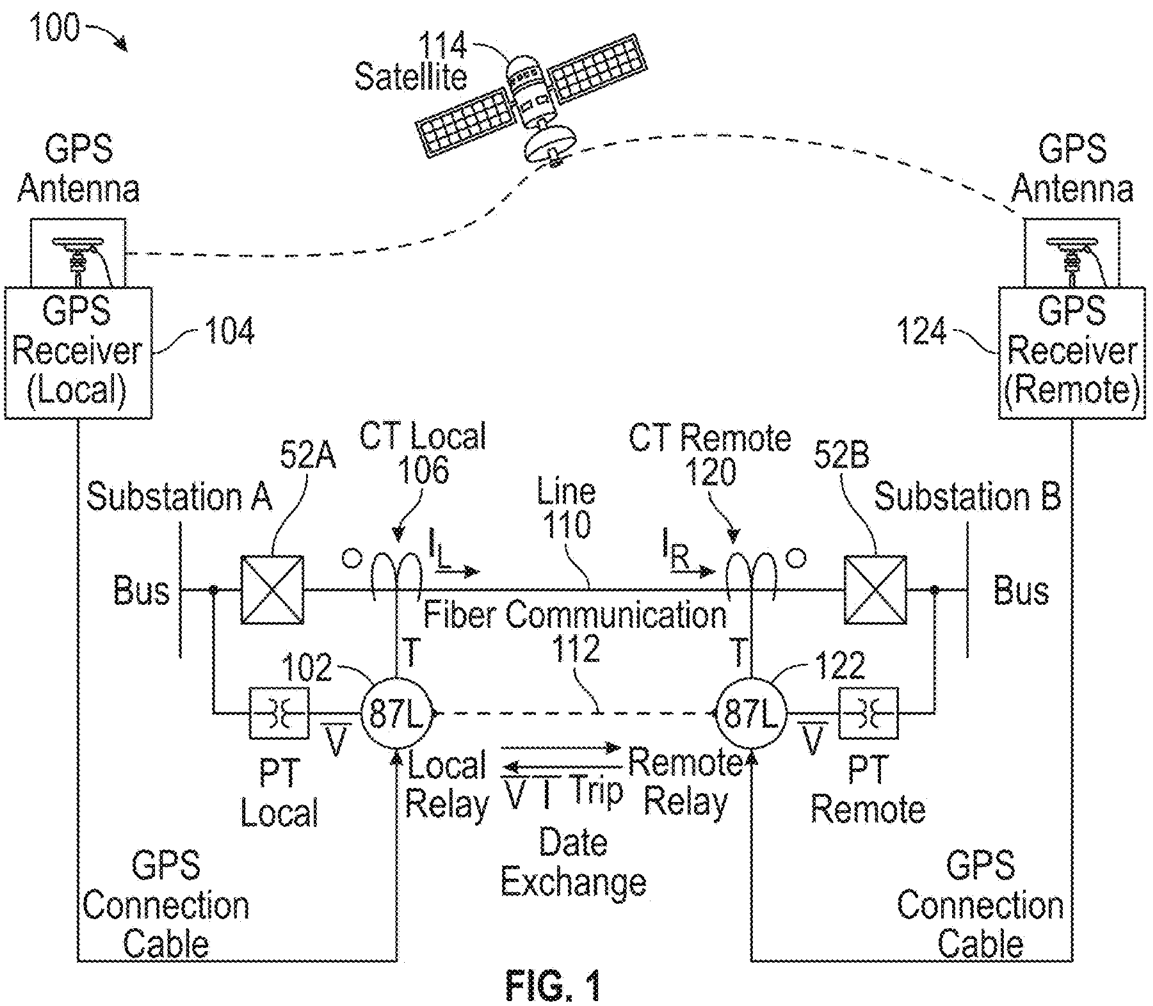
FIG. 1 is a diagram depicting a line differential protection scheme in accordance with the disclosed embodiments.

FIG. 1 is a diagram depicting a line differential protection scheme 100 in accordance with the disclosed embodiments. The line differential protection scheme 100 is an example of a line differential protection that is used in power systems to protect transmission or distribution lines by comparing the electrical currents at both ends of the line. For line differential protection, the protection zone is defined by the location of current transformers (CTs) monitoring the currents on either end of the transmission line. For example, in FIG. 1, CT 106 is located at a first substation and is connected to a first end of a transmission line 110. CT 106 is connected to a relay 102 (labeled 87L, where 87 is the American National Standards Institute (ANSI) device number for differential protection, and L stands for line, meaning the differential protection relay is used for protecting transmission lines) and is configured to feed the current to the relay 102. CT 120 is located at a second substation and is connected to a second end of the transmission line 110. CT 120 is connected to a relay 122 and is configured to feed the current to relay 122. In an embodiment, an optical fiber line 112 directly connects relay 102 and relay 122 to enable data communications between the relays. Additionally, relay 102 is connected (e.g., via coax cable) to a local GPS receiver 104 at the first substation, and relay 122 is connected to a remote GPS receiver 124 at the second substation. The local GPS receiver 104 and remote GPS receiver 124 communicate with one or more GPS satellites 114 to provide a time source for synchronizing relay 102 and relay 122. Relay 102 and relay 122 are also connected to one or more circuit breakers (not illustrated) at their respective substation for cutting power to/from the transmission line 110 when the relays issue a trip signal in the event of a fault.

In the depicted embodiment, CT 106 is referred to as the local (L) end and CT 120 is referred to as the remote (R) end. However, either end may be the local or remote end. Additionally, one end can act as a local end for a first test or first round of testing, and then the relationship can be switched where the other end can act as the local end for a second test or second round of testing. Thus, the configuration as to which end is the local end and which end is the remote end may be changed as desired. As shown in FIG. 1, the CT 106 senses the current ($\overline{I_L}$) along the transmission line 110 transmitted due to power flow between substation A and substation B (not illustrated). CT 120 senses the current ($\overline{I_R}$) at the receiving end of substation B. The relay 102 and relay 122 are configured to monitor the currents that are received from the other end of the transmission line 110. As stated above, line differential protection operates on the principle of KCL, which states that, under normal conditions, the current entering one end (e.g., $\overline{I_L}$ in FIG. 1) of the line should be equal to the current leaving the other end (e.g., $\overline{I_R}$ in FIG. 1). If there is a significant difference (i.e., an imbalance in the current beyond a certain threshold), this indicates a fault within the line, such as a short circuit, ground fault, or phase-to-phase fault. When a fault condition is established, the protective relays on both ends of the line (i.e., relay 102 and relay 122) must communicate with each other and issue a trip signal for the in-zone fault.

Two popular techniques for line current differential protection are percent differential protection and alpha plane differential protection. Percent differential protection compares the currents at both ends of the line and uses a percentage-based restraint mechanism to improve stability and avoid false tripping during external faults or heavy load conditions. Alpha plane differential protection enhances traditional line differential protection by analyzing the ratio of currents from both ends of a transmission line and plotting this ratio on a complex plane. Different relay manufacturers may enable one or both types of line current differential protection.

Figure 2:
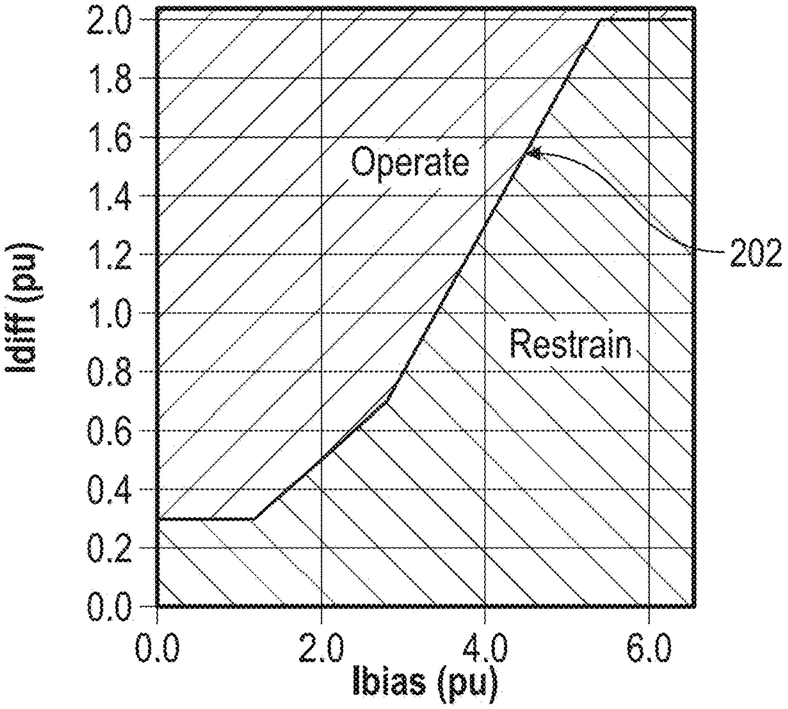
FIG. 2 is a diagram depicting an example of a single slope differential element for performing percent differential protection in accordance with the disclosed embodiments.

FIG. 2 is a diagram depicting an example of a single slope differential element for performing percent differential protection in accordance with the disclosed embodiments. In a percentage differential protection, the differential protection will operate when the differential current $I_{diff}$ is higher than a minimum pickup value and above a percentage of the restraining signal $I_{bias}$, as defined the following Differential Element Characteristic Equation: $I_{diff}$>Pickup+% Slope*$I_{bias}$. The differential element described by the Differential Element Characteristic Equation may have a characteristic similar to that depicted in FIG. 2. The element will trip for points above the line 202 and restrain for points below the line 202, which define the operation and restrain zones on the characteristic. Different relay manufacturers may have different relay characteristics.

Figure 3:
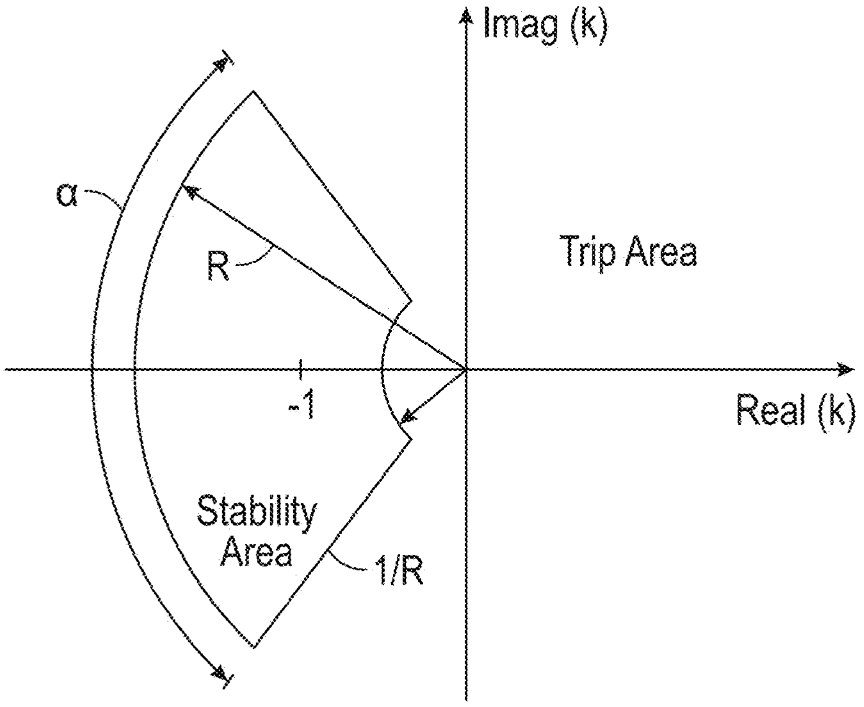
FIG. 3 is a diagram depicting alpha plane characteristics for performing alpha plane differential protection in accordance with the disclosed embodiments.

FIG. 3 is a diagram depicting alpha plane characteristics for performing alpha plane differential protection in accordance with the disclosed embodiments. For the alpha plane characteristic, the ratio of phase currents (or sequence currents) entering or leaving a transmission line is geometrically represented on a complex plane as shown in FIG. 3. A complex plane is a two-dimensional coordinate system used to visually represent complex numbers, where the horizontal/real axis represents the real part of a complex number and the vertical/imaginary axis represents the imaginary part of complex number. In FIG. 3, k represents the ratio of the currents (i.e., $\overline{I_R}/\overline{I_L}$). The currents considered for the ratio calculation can be either monitored values of phase currents at remote and local relays (e.g., relay 102 and relay 122 in FIG. 1) or derived currents from calculations involving equations that use real and imaginary parts of differential and restrain currents obtained from monitored phase currents. Each phase has its alpha plane characteristics. The usage of these algorithms varies by relay models. The alpha plane characteristic parameters can be used to determine the area of stability and the trip area by mapping the percentage differential characteristics onto the real part of k (Real (k)) and the imaginary part of k (Imag (k)) of the complex plane. The restrain region is defined by parameters such as the radius of the greater arc (R), the radius of the inner arc (1/R), and the angle (α). The radius of the greater arc and inner arc determines the radius of the restrain region (stability area), and the angle (α) represents the angular extent of the restrain region.

Figure 4:
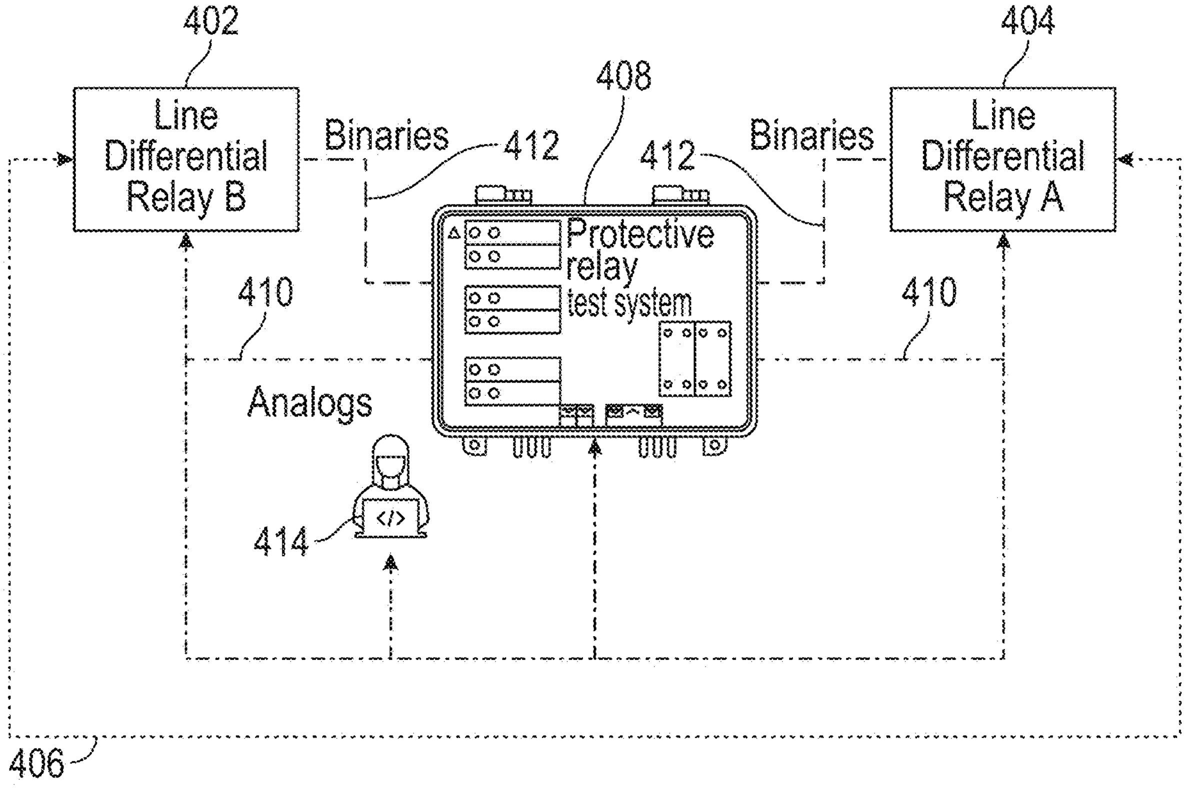
FIG. 4 is a diagram depicting bench or lab testing using a single test in accordance with the disclosed embodiments.

FIG. 4 is a diagram depicting bench or lab testing using a single test in accordance with the disclosed embodiments. Traditional line differential relay testing methods such as loopback, back-to-back bench (lab), and end-to-end testing have been the standard approach for validating relay functionality set. As shown in FIG. 4, in bench/lab testing, relay pairs such as line differential relay 402 and line differential relay 404 are connected to each other via a fiber optic cable 406. Depending on the test method, the relay pair is tested using one or two relay test sets, such as relay test set 408. The SMRT relay test set 408 may be connected to each line differential relay using a pair of analog 410 and digital 412 (binary) connections. In some embodiments, the relay test set 408 may have a wireless or wired data connection to a computing device 414 such as a laptop that execute software for running the line differential relay testing methods. Alternatively, in some embodiments, the software may be integrated in the relay test 408.

As shown in FIG. 4, in some embodiments, a single relay test set 408 may be enough to test line differential relay 402 and line differential relay 404 when the relay test set 408 can produce two sets of currents of a magnitude high enough for the purposes of the test. If not, two or more relay test sets 408 may be required. However, even under laboratory conditions, inaccurate results may occur when using multiple relay test sets 408 to perform dynamic testing without synchronizing their clocks. This is because the time difference between the test sets 408 can cause the relay to improperly measure the differential current, which can lead to relay mis-operations. Thus, in some embodiments, when multiple relay test sets 408 are used, the relay test sets 408 can be synchronized with GPS, typically using IRIG-B (encodes standard serial time), using a GPS signal or a dedicated synchronization device. The disclosed embodiments may utilize other types of time signals (e.g., Primary Oscillation Points (POP)). Balanced and fault currents are injected into the primary 402 and secondary relays 404 to assess stability and trip scenarios.

However, the depicted bench or lab testing setup in FIG. 4 has limitations as it only partially assesses the relays and protection scheme's features and does not provide the characteristics of the line differential function under real world operating conditions. For example, the line differential characteristic can be affected by the performance of the communication channels used to implement them which can only be properly assessed with field testing. Further, current technology relies on state sequencer logic, which restricts the ability to test line differential schemes fully. This static testing process is time-consuming and may not offer comprehensive validation of the relays.

For line differential relays to be thoroughly tested and commissioned, real-world setups are essential. In various line topologies, these relays are typically deployed between substations on the same transmission line or at multiple terminals, such as T junctions. Ensuring the proper operation of line differential relays and their fiber optic connections is crucial to prevent maloperations during fault conditions or out-of-zone faults. End-to-End tests are conducted in such scenarios, requiring two relays at different locations to relate to fiber optic cables and use a GPS time synchronization system, such as PPS or IRIG-B.

Figure 5:
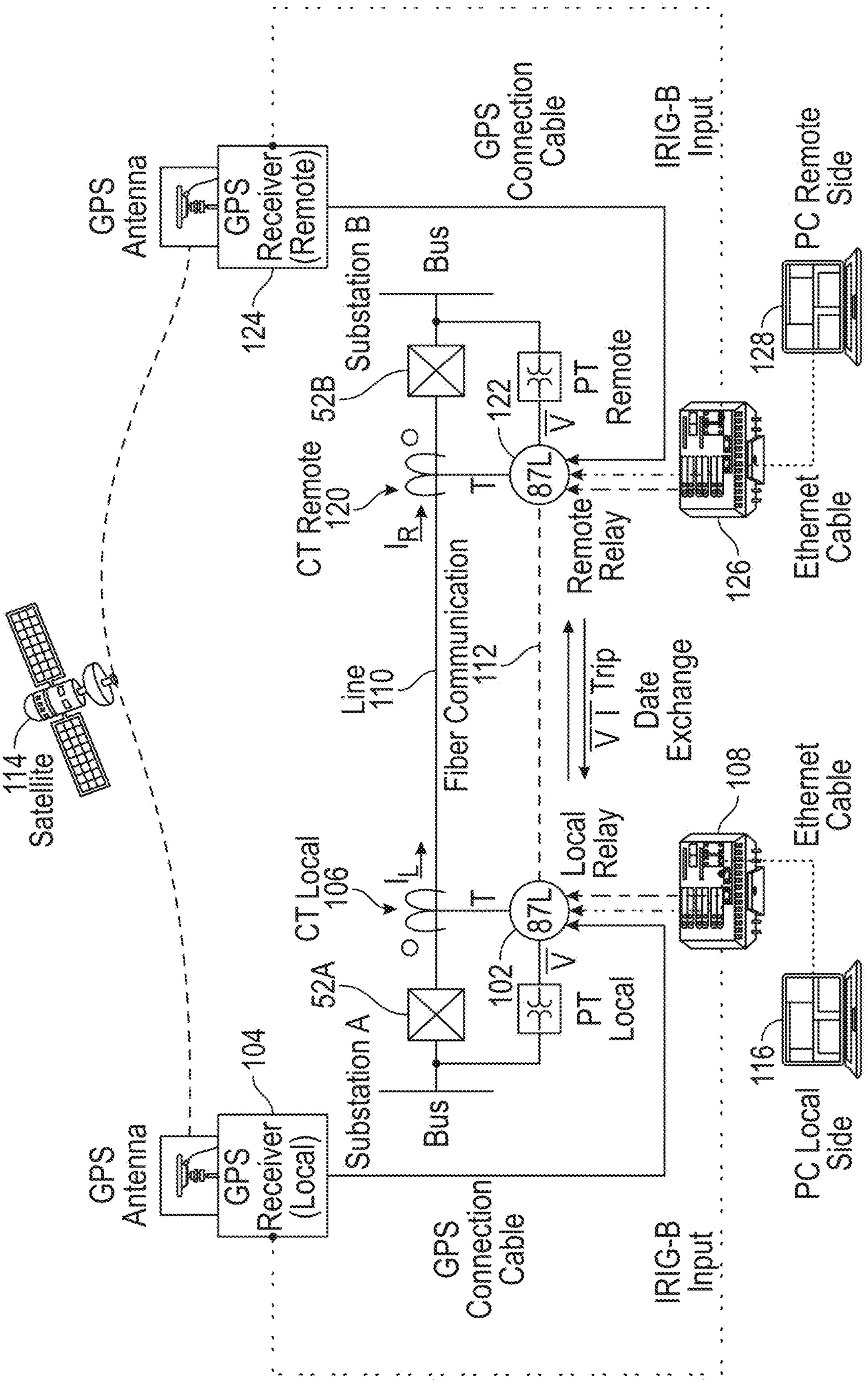
FIG. 5 is a diagram illustrating end-to-end line differential testing in accordance with the disclosed embodiments.

FIG. 5 is a diagram illustrating traditional end-to-end line differential testing in accordance with the disclosed embodiments. In particular, FIG. 5 depicts end-to-end line differential testing on the line differential protection scheme 100 described in FIG. 1. One advantage of end-to-end line differential testing scheme is that it goes beyond testing the individual elements of the protection scheme and aims for the verification of the whole system. During this type of test, the line differential scheme can be evaluated by simulating fault conditions simultaneously at different points of the line. For instance, by simulating fault conditions simultaneously at each end of the transmission line, end-to-end line differential testing enables evaluation or testing of the entire relay protection scheme including, but not limited to, protective relays, interface equipment, and communication equipment all under real world operating conditions.

In the depicted embodiment, a relay test set 108 is connected to relay 102 for communicating both analog and digital data as described above. Relay test set 108 also has a connection to the local GPS receiver 104 and a computing device 116. Similarly, on the remote end, relay test set 126 is connected to relay 122 and has a connection to the remote GPS receiver 124 and a computing device 128. The computing device 116/computing device 128 may be any type of computing device (e.g., personal computer (PC), laptop, tablet, smart phone, etc.) comprising memory configured to store software/executable instructions and one or more processors configured to execute the instructions for enabling the relay test set 108/relay test set 126 to inject currents to simulate fault conditions. Together, the relay test set 108 and the computing device 116 make up the local relay test system, and the relay test set 126 and the computing device 128 make up the remote relay test system. It should be noted, that in some embodiments, the relay test set 108 and/or relay test set 126 may be able to perform end-to-end testing without an external PC connection/computing device (i.e., the software is integrated into the relay test set). As stated above, it is important to synchronize the test systems at each end so that test quantities can be injected into all the controllers involved simultaneously to accurately simulate the real-time conditions that a line differential protection scheme would encounter during operation. For instance, in line differential protection, the phase relationship between the currents at the two ends of the line is critical. Any mismatch in phase or magnitude could trigger a fault response from the relay. Injecting the currents into both relay test units at the same time ensures a correct phase relationship between the currents at both ends, allowing the relay to determine whether the currents are balanced (normal conditions) or unbalanced (fault condition). Additionally, simultaneous injection helps test the communication channel between the relays, ensuring that they can exchange current measurements accurately and in real-time, and verifies that the relays make correct trip decisions based on synchronized current inputs from both ends. If the injections are not simultaneous, one relay might receive outdated or mismatched current information, leading to incorrect or inconsistent trip decisions.

In an embodiment, a time signal from a GPS clock obtained from the respective GPS receiver can be used to synchronize multiple test systems. Time signals are available in various standards, such as 1 PPS (pulse per second), IRIG-B, and PTP (Precision time protocol). When using IRIG-B time synchronization for end-to-end testing, multiple relay test sets are required to decode the IRIG-B signal. This signal is used to trigger the simultaneous injection of analog values. In some embodiments, the IRIG-B signal obtained from a GPS Receiver can also be provided to the relays under test (i.e., relay 102 and relay 122). In some embodiments, during testing, relay test set 108 and relay test set 126 can be synchronized independently of the timing mechanism used by the relay 102 and the relay 122.

Traditional end-to-end line differential testing as shown in FIG. 5 has several limitations. For instance, traditional end-to-end testing are generally performed using sequencer tool techniques, which allow injecting faults in defined states to verify operation and non-operation scenarios. However, this testing process has a limitation in that it is impossible to perform the line differential characteristics tests at multiple test points in continuous search mode. The challenge to performing this is that both test sets should be synchronized, and the test points applied should be synchronized dynamically with the GPS signal to maintain the correct phase angle relationships between the two relays under test. However, it is difficult to perform and meet the scenarios above using the sequencer method to perform the dynamic testing. Additionally, these tests are limited to performing single point in slope characteristics and stability tests. Further, traditional end-to-end testing necessitates the presence of two skilled protection engineers at each end with connected test sets. Coordinating the tests becomes complex, and synchronizing test currents and voltages with accurate phase angles is critical to avoid maloperations in performing the dynamic functional testing.

To address the above issues associated with traditional end-to-end line differential testing, the present disclosure describes various systems and methods for providing a cloud-based line differential testing method that aims to overcome one or more of the limitations of traditional approaches and enables more comprehensive testing of line differential relays. The disclosed embodiments leverage cloud technology and modern internet services to create a seamless and efficient testing process. In an embodiment, two relay test systems are connected to the cloud, where the remote end remains idle until required. With the disclosed embodiments, only one protection engineer is needed to connect and control both end relay test systems remotely using the relay test software and cloud daisy-chain synchronization mode. The disclosed embodiments eliminate the need for physical presence at the remote end to perform end-to-end line differential testing, and thus, significantly saving time and resources.

Figure 6A:
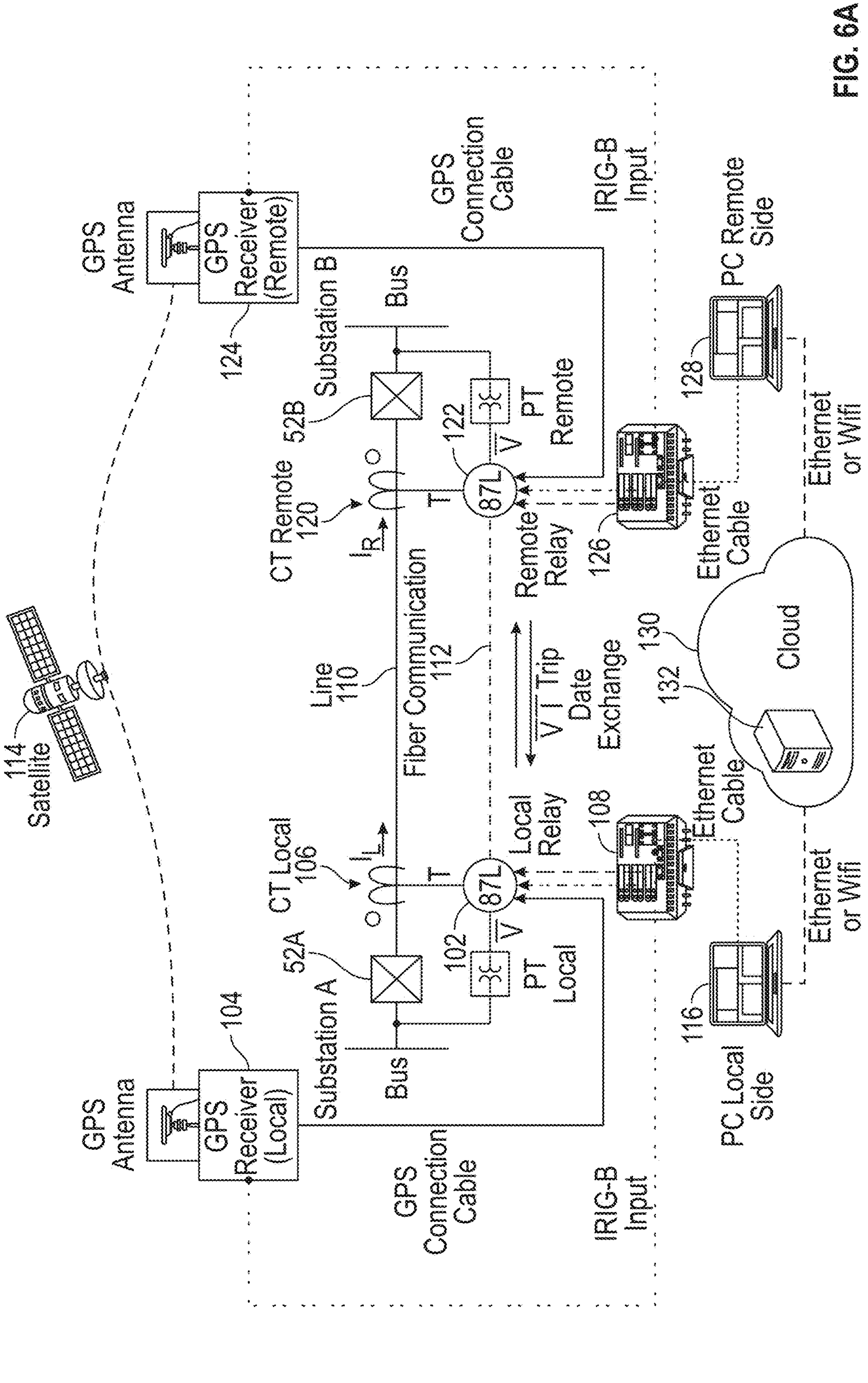
FIG. 6A is a diagram illustrating cloud-based end-to-end line differential testing in accordance with the disclosed embodiments.

FIG. 6A is a diagram illustrating cloud-based end-to-end line differential testing in accordance with the disclosed embodiments. In the depicted embodiment, the local relay test system and the remote relay test system, as described in FIG. 5, are connected to a cloud 130. For example, both the local computing device 116 and the remote computing device 128 are configured to execute a new cloud-based end-to-end line differential testing software application that connects each device to a server 132 that provides cloud services, as described herein. The connection may be a wired (e.g., Ethernet) or wireless connection (e.g., WIFI). In an embodiment, the remote relay test system is connected as a remote mode and remains idle until needed. In an embodiment, the local test system can quickly identify the remote end test system by specifying its name or address. This streamlined process simplifies the setup and ensures proper communication between the two ends. Once the remote relay test set is found, the local test system is configured to execute instructions associated with the cloud-based end-to-end line differential testing software to virtually daisy chain (i.e., combine) both the local and the remote relay test systems to enable the local relay test system to treat both the local and the remote relay test systems as a single integrated relay test system. Certain embodiments may use the Transmission Control Protocol (TCP) and Passthrough instances in the server to achieve this setup and successful operation. For example, in some embodiments, the server 132 may comprise a remote module controller (RMC) software module and extendable Input Outputs (XIO) software module are configured to provide the required communication functions. In an embodiment, the TCP ports in server 132 act as a passthrough or doorway through which communication between the local relay test system and the remote relay test system takes place. For example, the TCP ports in the server 132 may be designated as ports that are configured to listen for incoming instructions or commands from the local computing device 116. The server 132 is responsible for receiving messages from the local computing device 116 and forwarding the messages to the remote computing device 128. Generally, the relay test system that initiates communication with the server 132 for establishing a connection with a test system on another end is referred to as the local relay test system. As stated, the local relay test system sends commands or requests to the remote relay test system through the designated TCP port(s) of the server 132 and be configured to wait for responses from the remote relay test system after sending an instruction. In an embodiment, the remote test set acts as a passive entity in this communication setup. It awaits instructions from the local computing device 116 to perform specific actions or tasks. For instance, an example the communication process is as follows:

Step 1: On the remote end, the remote computing device 128 establishes a communication connection with the relay test set 126 (e.g., using an Ethernet hard-wired connection or other types of communication connection). The remote computing device 128 also establishes an Internet connection (via hard-wired or wireless connection). As previously stated, in some embodiments, the functions performed by the remote computing device 128 may be integrated into the relay test set 126. Thus, as referenced herein, the remote computing device 128 when connected to the relay test set 126 or when integrated with the relay test set 126 is referred to as a relay test system or a remote relay test system.

Step 2: The remote relay test system is set as a remote device (e.g., by selecting Remote only option in user interface) and initiates communication by sending a command or request for establishing communication with the local computing device 116 to the server 132 (e.g., to a designated TCP port of the server for exchanging messages between the local computing device 116 and the remote computing device 128). The command or request may include first authentication information such as, but not limited to, a password, a code, or other identifier for authenticating the remote computing device 128.

Step 3: The server receives the command from the remote computing device 128.

Step 4: On the local end, the local computing device 116 establishes a communication connection with the relay test set 116 (e.g., using an Ethernet hard-wired connection or other types of communication connection). The local computing device 116 also establishes an Internet connection (via hard-wired or wireless connection). It should be noted that step 4 may be performed at any time (e.g., before, concurrent with, or after steps 1 and 2). Similar to above, in some embodiments, the functions of the local computing device 116 may be integrated into the relay test set 108. Thus, as referenced herein, the local computing device 116 when connected to the relay test set 108 or when integrated with the relay test set 108 is referred to as a relay test system or a local relay test system.

Step 5: The local relay test system initiates communication by sending a command or request for establishing communication with the remote relay test system to the server 132 (e.g., to the designated TCP port). Similarly, the command or request may include second authentication information such as, but not limited to, a password, a code, or other identifier for authenticating the local relay test system.

Step 6: The server 132 receives the command from the local relay test system.

Step 7: The server 132 verifies the remote relay test system using the first authentication information and verifies the local relay test system using the second authentication information. In some embodiments, the first authentication information and the second authentication information comprise a password that must match. When the remote relay test system and the local relay test system are authenticated, the server 132 establishes a daisy chain connection between the remote relay test system and the local relay test system. For example, in an embodiment, the server 132 may create a virtual network or peer-to-peer connection to bridge/connect the remote relay test system and the local relay test system. The server 132 is then configured to act as a relay or switch between the remote relay test system and the local relay test system, managing the communication through virtual network interfaces. In some embodiments, the daisy chain connection enables data to flow between the remote relay test system and the local relay test system through one or more designated ports of the server 132. The server 132 then forwards any messages or commands between the remote relay test system and the local relay test system.

Step 8: On the remote end, the remote relay test system receives a command from the local relay test system (either the command sent at step 5 or another command sent by the local relay test system). In an embodiment, the command comprises test parameter values (e.g., current values, voltage values, and a start time) for executing one or more line differential relay protection tests. The one or more line differential relay protection tests is referred to herein as a sequence of line differential relay protection tests. The remote relay test system initiates the sequence of line differential relay protection tests based on the command. Similarly, on the local end, the local relay test system simultaneously initiates the sequence of line differential relay protection tests based on the command. In an embodiment, once the sequence of line differential relay protection tests begins, the tests in the sequence of line differential relay protection tests are executed sequentially, without user-interaction, and simultaneously on both the local relay test system and the remote relay test system based on the test parameter values and a synchronized start time.

Step 9: Once the sequence line differential tests are completed on the remote end, the remote relay test system sends a response or result back to the server 132.

Step 10: The server 132 forwards the response from the remote relay test system to the local relay test system.

Step 11: The local relay test system receives the response and processes the information as needed. For example, the local relay test system may determine whether the relay 102 and the relay 122 are operating correctly based on the response. The local relay test system may also initiate additional test/commands on both ends based on the response.

Figure 6B:
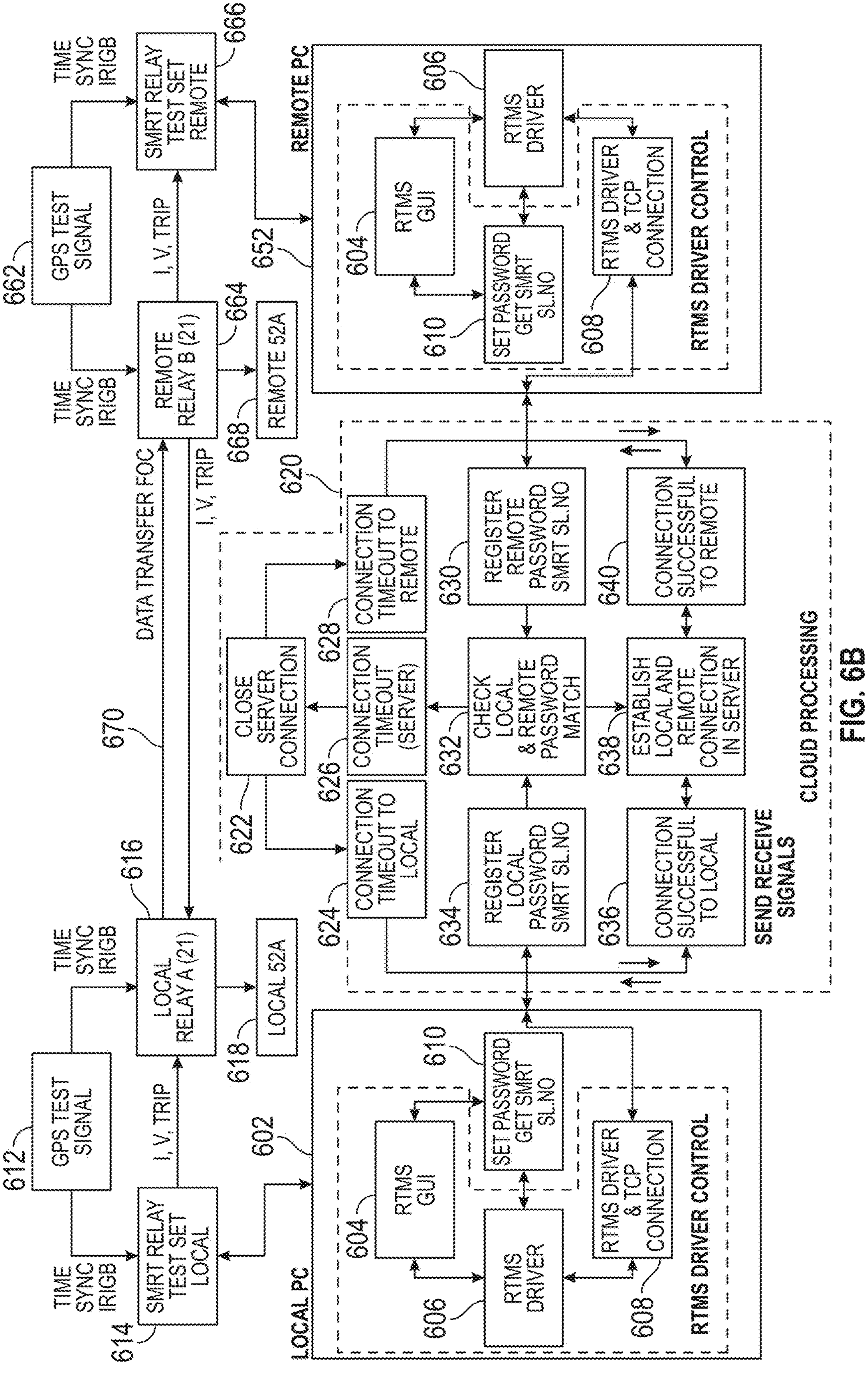
FIG. 6B is a block diagram illustrating components of a cloud-based end-to-end line differential testing in accordance with the disclosed embodiments.

FIG. 6B is a block diagram illustrating components of a cloud-based end-to-end line differential testing in accordance with the disclosed embodiments. In the depicted embodiment, a local substation comprises a local relay test system including a local relay 616 in communication with a local relay test set 614, which is in communication with a local PC 602. Similarly, a remote substation comprises a remote relay test system including a remote relay 664 in communication with a remote relay test set 666, which is in communication with a remote PC 652. The local PC 602 and remote PC 652 may be examples of the local computing device 116 and the remote computing device 128 described above. The local relay 616 is connected to a local circuit breaker 618 to trip in case of a fault. The remote relay 664 is connected to a remote circuit breaker 668. The local relay 616 is connected to the remote relay 664 using communication line 670 (e.g., a fiber-optic cable) for enabling data exchange such as, but not limited to, current (I), voltage (V), and trip data. As described above, at both the local and remote locations, the relays 616/664 and the relay test sets 614/666 are configured to receive a GPS test signal 612/662 for enabling time synchronization so that both the local and remote test systems inject the inputs to the relays at the same time.

As depicted in FIG. 6B, both the local PC 602 and the remote PC 652 are configured to store and execute a relay test management software (RTMS). The RTMS includes a RTMS graphical user interface (GUI) module 604, a RTMS driver module 606, a RTMS driver and TCP connection module 608, and a set password and get SMRT (Smart Relay Test System) serial number module 610. The GUI module 604 is configured to provide an integrated user interface for enabling one end (e.g., the local PC 602) to be able to control both relay test systems. The RTMS driver module 606 is configured to obtain and send the present values (i.e., the test values specified in a user interface) of the local/remote relay to systems for performing end-to-end line differential testing. For example, in an embodiment, the RTMS driver module 606 on the local PC 602 may be configured to obtain the present values of the local relay test system, send the present values of the local relay test system to a server 620, and receive from the server 620 the present values of the remote relay test system. The RTMS driver module 606 on the remote PC 652 may be configured to perform a similar function on the remote end. The RTMS driver and TCP connection module 608 is configured to establish a connection with the designated TCP ports of the server 620 for sending and receiving data to and from the server 620. The set password and get SMRT serial number module 610 is configured to set or exchange passwords and/or obtaining a serial number of a relay test set for authorizing and verifying that the test is being performed on the correct relay test systems. The password may be used to verify that the user or system is authorized to perform the line testing and the serial number may be used to verify that the correct relay test set is being used for the test. In some embodiments, the version or the configuration of the RTMS installed on the remote PC 652 may be different from that of the local PC 602 (e.g., certain functions may not be available on the remote PC 652 because the remote PC 652 is not controlling the testing).

The server 620 comprises a cloud server connection module 622, a connection timeout to local module 624, a connection timeout to server module 626, a connection timeout to remote module 628, a register remote password and SMRT serial number module 630, a checked local and remote password match module 632, a registered local password and SMRT serial number module 634, a connection successful local module 636, an establish local and remote connection in server module 638, and a connection successful remote module 640. The cloud server connection module 622 is configured to close/terminate the connection between the server and the local PC 602 and/or the remote PC 652 in response to receiving a connection timeout from the local PC 602 as determined by the connection timeout to local module 624, a connection timeout from the remote PC 652 as determined by the connection timeout to remote module 628, or a connection timeout from the server as determined by the connection timeout to server module 626. A connection timeout occurs when a connection cannot be established between the server 620 and the local PC 602 or remote PC 652 within a certain time period (e.g., may timeout if connection response is not received within 30 seconds) or there is inactivity on the connection for a predetermined amount of time (e.g., TCP connections may time out after 5 to 20 minutes of inactivity). The registered local password and SMRT serial number module 634 is configured to obtain the password and SMRT serial number from the local PC 602. The register remote password and SMRT serial number module 630 is configured to obtain the password and SMRT serial number from the remote PC 652. The checked local and remote password match module 632 is configured to verify the password and SMRT serial number received from the local PC 602 and the remote PC 652. If the passwords and SMRT serial numbers are verified, the checked local and remote password match module 632 indicates to the establish local and remote connection in server module 638 to establish a connection between the server 620 and the local PC 602 (using the connection successful local module 636) and a connection between the server 620 and the remote PC 652 (using the connection successful remote module 640), otherwise the checked local and remote password match module 632 indicates to the connection timeout to server module 626 that the passwords and/or SMRT serial numbers are not verified, which may trigger a disconnection to the local PC 602 and/or the remote PC 652. Once the server 620 establishes a connection with both the local PC 602 and the remote PC 652, the server 620 is configured to exchange information between the local PC 602 and the remote PC 652 for enabling cloud-based end-to-end line differential testing.

It should be noted that even when two PCs (e.g., the local computing device 116 and the remote computing device 128) or relay test systems are used, the test control for both test sets is done from only one end of the line. In an embodiment, the cloud-based end-to-end line differential testing software provides a single user interface that enables the local computing device 116 to simultaneously control both the local and the remote relay test systems. Additionally, because both relay test systems are controlled by a single device, the disclosed embodiments can dynamically synchronize both relay test systems with GPS IRIG-B signals or other timing signals, ensuring accurate phase angle relationships and avoiding maloperations during fault simulations. Thus, the disclosed embodiments enable protection engineers to perform comprehensive testing including stability tests, pickup tests of both local and remote ends, timing tests, characteristics search tests, and characteristics shot tests. Additionally, by combining both the local and the remote relay test systems into a single integrated relay test system, the disclosed embodiments eliminate the need for the presence of a protection engineer at the remote end.

Figure 7A:
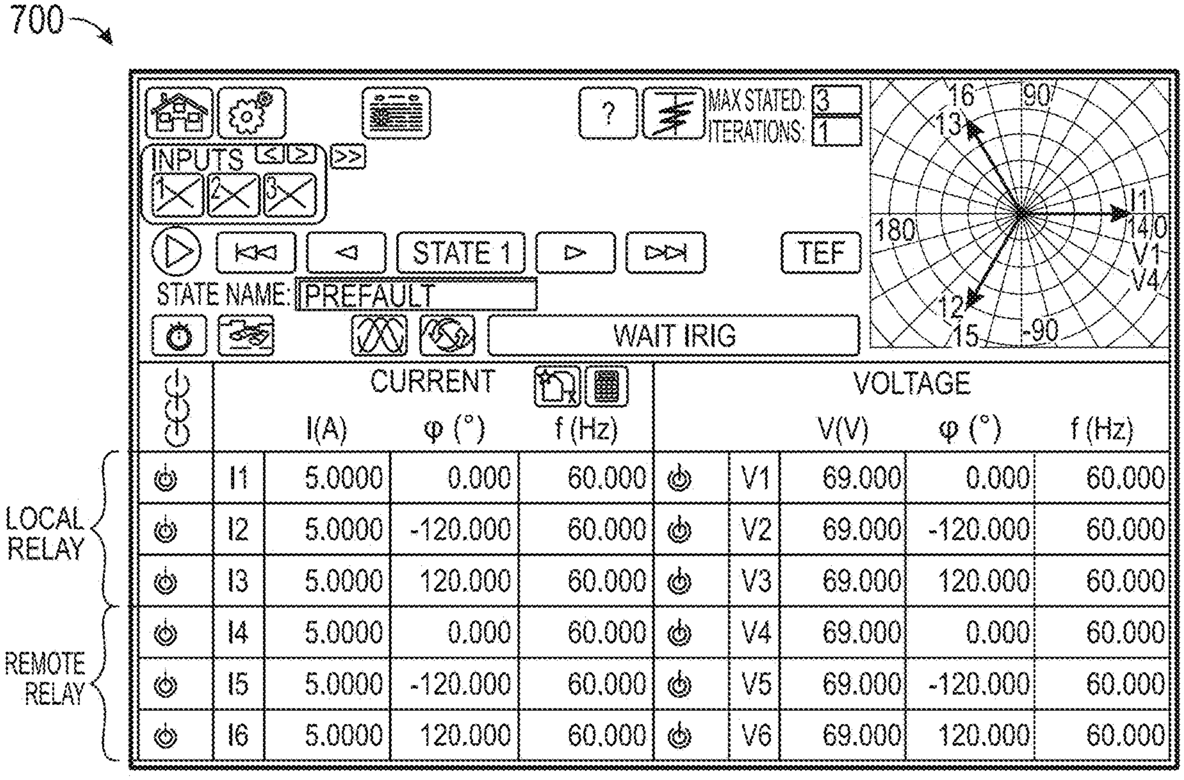
FIG. 7A and FIG. 7B are diagrams of a user interface for configuring manual cloud-based end-to-end line differential testing in accordance with the disclosed embodiments.
Figure 7B:
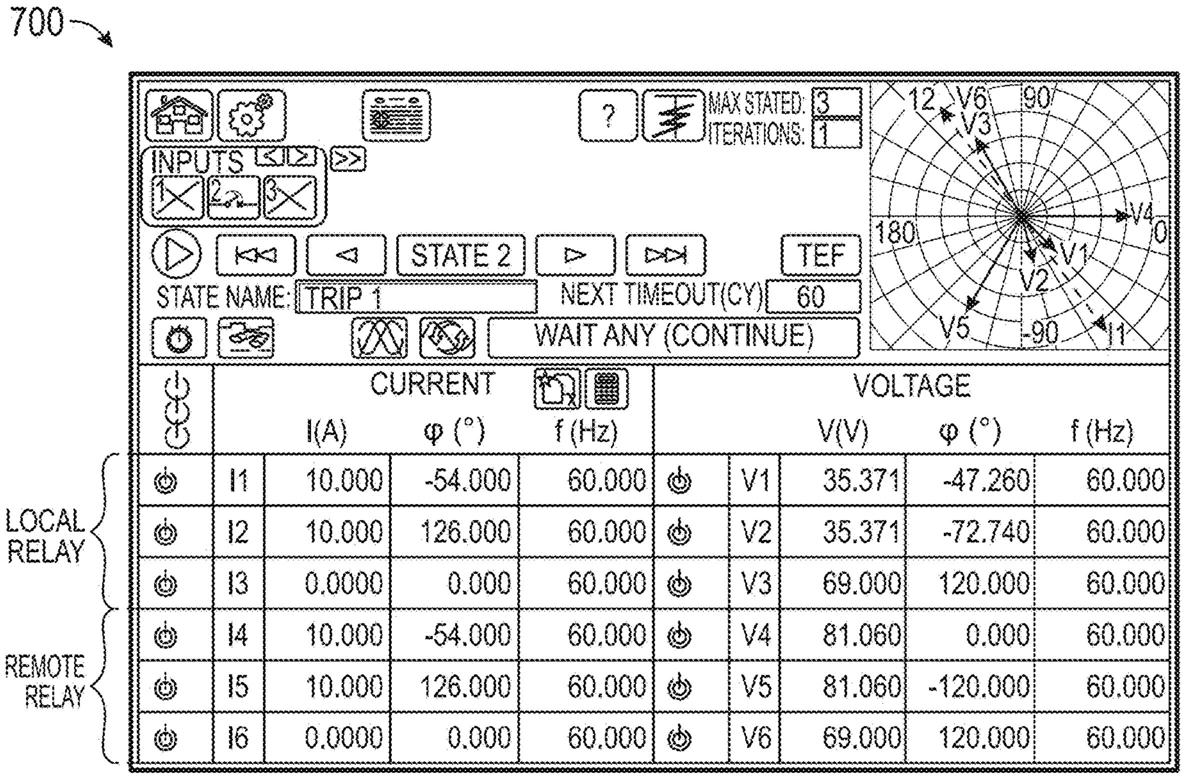

FIG. 7A and FIG. 7B are diagrams of a user interface 700 for configuring manual cloud-based end-to-end line differential testing in accordance with the disclosed embodiments. The user interface 700 enables a protection engineer to configure manual end-to-end line differential testing from just one end of the line. For example, FIG. 7A illustrates manual configuration of current and voltage parameters for testing a prefault state (i.e., normal load condition) of the local relay and the remote relay. In the prefault state, the local relay and the remote relay should not issue a trip signal. Whereas, FIG. 7B illustrates manual configuration of current and voltage parameters for testing a fault state of the local relay and the remote relay. The local relay test system and the remote relay test system inject the prefault/fault with GPS time synchronized analog inputs to the relays (i.e., the SMRT tester at local and remote should trigger at the same time for line differential relay (87L) correct operation). In the fault state, the local relay and the remote relay are expected to issue a trip signal.

Figure 8:
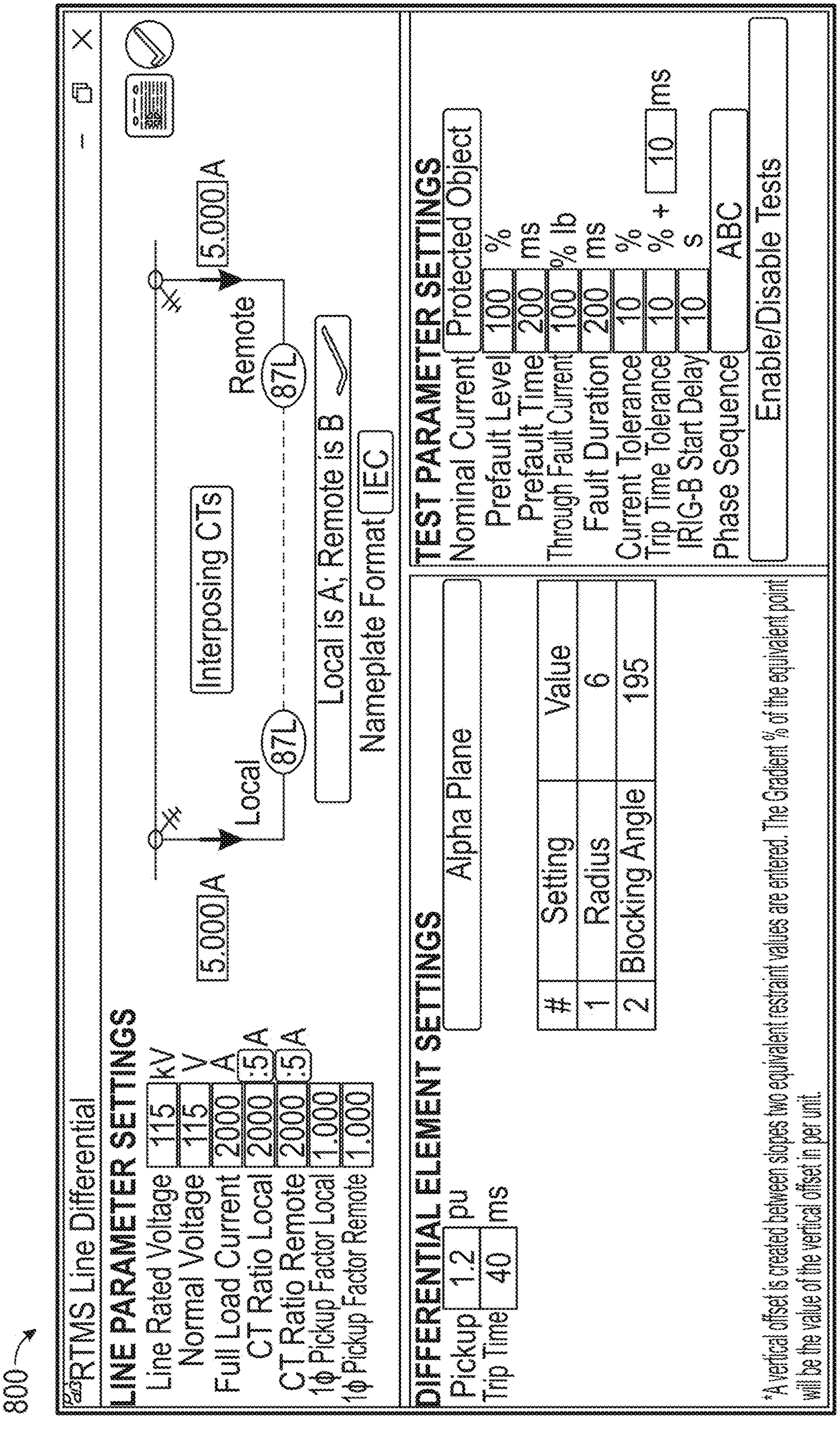
FIG. 8 is a diagram of a user interface for configuring dynamic cloud-based end-to-end line differential testing in accordance with the disclosed embodiments.

FIG. 8 is a diagram of a user interface 800 for configuring dynamic cloud-based end-to-end line differential testing in accordance with the disclosed embodiments. In particular, user interface 800 enables a protection engineer to configure line parameters (e.g., line rated voltage, nominal voltage, full load current, local CT ratio, remote CT ratio, local pickup factor, and remote pickup factor) and the line's current differential protection element parameters for performing alpha plane differential protection (e.g., pickup tests, radius tests, angle tests, search tests, etc.). As stated above, the alpha plane is used to plot the ratio of currents from both ends of the line under different conditions (like load flow, faults, or disturbances). In an embodiment, the local computing device 116 generates test parameters (e.g., nominal current, prefault level, prefault time, through fault current, fault duration, current tolerance, trip time tolerance, and IRIG-B start delay) based on the line differential characteristic under the test. As stated above, the local computing device 116 can perform the alpha plane differential protection test dynamically because both relay test systems are dynamically synchronized. For example, in some embodiments, the local computing device 116 continuously computes and derives timing information based on GPS IRIG-B signals and automatically sets/synchronize any time delay. In an embodiment, the local computing device 116 is configured to dynamically perform a sequence of tests including a stabilization test, a pickup test, a characteristic search test for a percent differential element, a characteristic search test for an alpha plane element, a characteristic shot test for a percent differential element, and a characteristic shot test for an alpha plane element.

Figure 9:
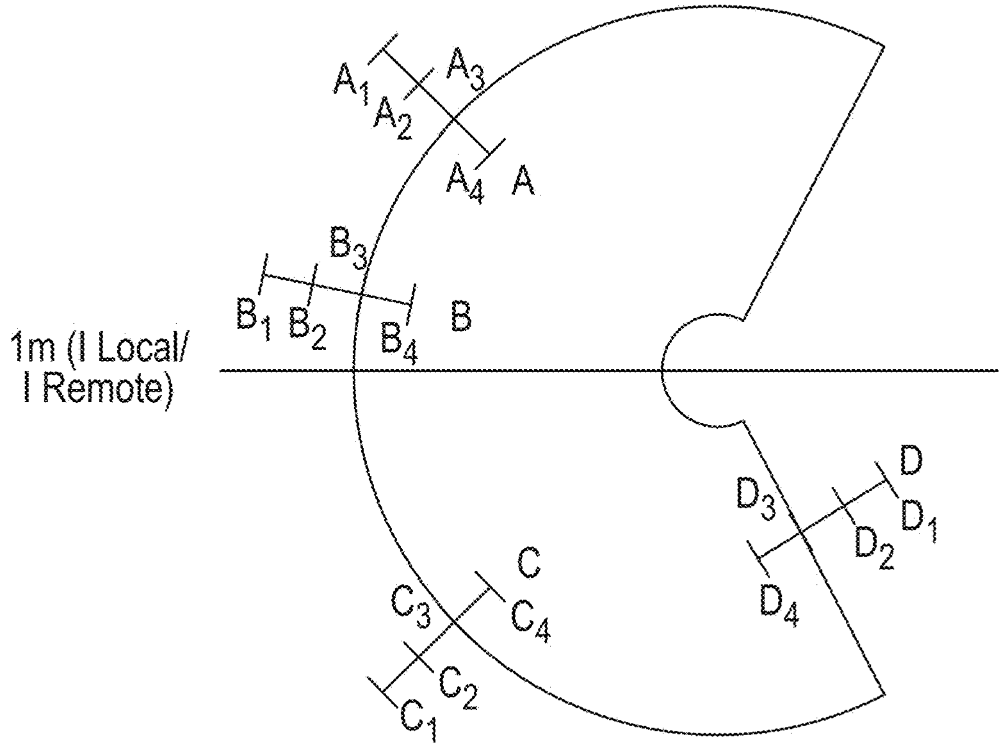
FIG. 9 is a diagram illustrating relay differential characteristics testing according to an embodiment of the present disclosure.

FIG. 9 is a diagram illustrating relay differential characteristics testing according to an embodiment of the present disclosure. In particular, in FIG. 9, 4 test lines (A, B, C, and D) are shown with injection points A1, A2, A3, A4, B1, B2, B3, B4, C1, C2, C3, C4, D1, D2, D3, D4 for each test lines respectively. A3, B3, C3, and D3 are the theoretical operating points of the defined settings. The operating points indicate the specific thresholds or conditions under which the relay is expected to operate or "trip," and issue a protective action in response to a fault on a power line. FIG. 5, as described above, illustrate the set up and test methods to find A3, B3, C3, and D3 operating points. Specifically, two skilled test engineers (one at one end of the line and the other at the other end of the line) need to coordinate testing to simultaneously inject values for A1, then A2, then A3, and then A4 to find the correct operating value. This process continues for the test lines B, C, and D. It is important that each test points A1 to D4 are applied independently as a steady-state injection (i.e., current and voltage remain constant or vary in a predictable, non-transient manner over time) with time synchronization every instance. Therefore, the two skilled test engineers on the local side and remote side need to coordinate to manually apply fault for each injection point. Thus, currently, dynamic testing (where the fault is injected with all test points A1 to D4) is impossible to perform.

However, as described herein, the disclosed cloud-based end-to-end line differential testing can perform dynamic relay differential characteristics testing because one operator and one system can control the testing of both relays, and can automatically synchronize the tests based on a time signal. For example, using the disclosed embodiments, all 4 test lines (A, B, C, and D) can be dynamically tested in one shot upon receiving an execution command on the local relay test system. For instance, the fault state injects from A1, A2, A3, and A4. In an embodiment, if the relay operates at A3, the test skips A4 and moves to the next test point. In an embodiment, each fault point A1, A2, A3, and A4 are time synchronized with IRIG signals and applied without any user intervention. Upon completion of the A line test, the test continues applying fault from B1, B2, B3, and B4. If the relay operates at B3, it skips B4 and each point applied between local and remote relays with time synchronized values. Similarly, upon completion of the B line test, the test continues applying fault from C1, C2, C3, and C4 in a similar manner, and then proceeds to continuously apply fault from D1, D2, D3, and D4 in a similar manner until all 4 test lines have been tested.

Figure 10:
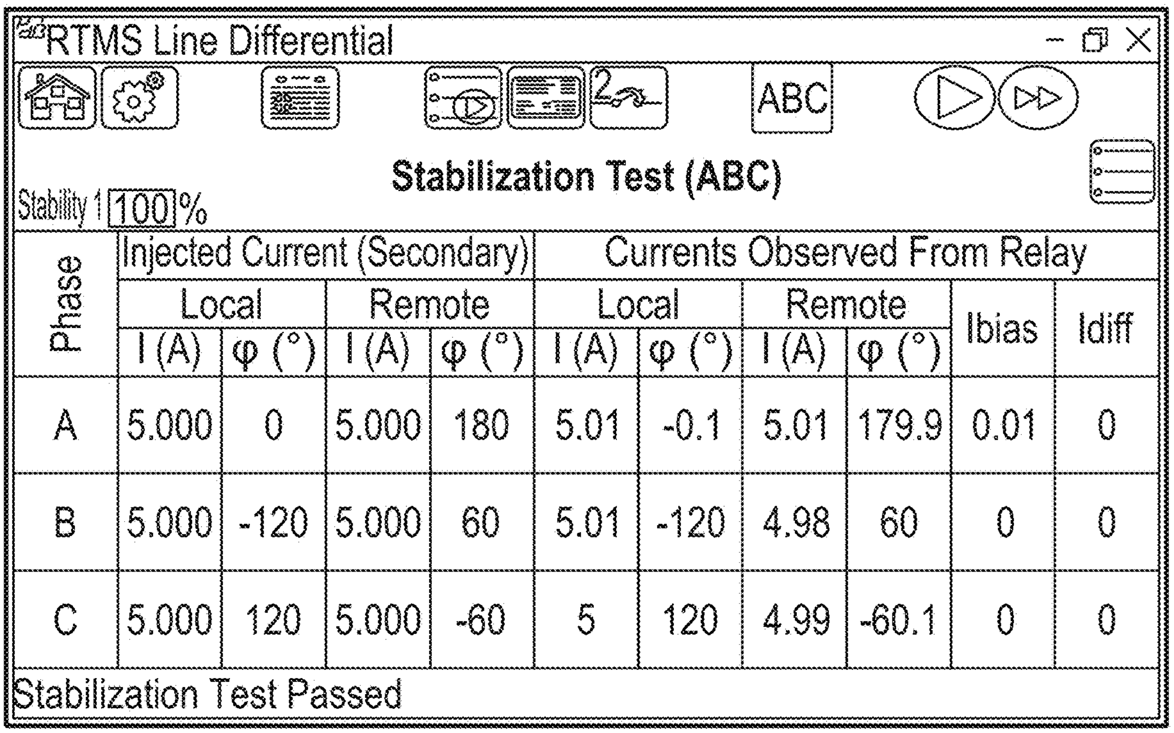
FIG. 10 is a diagram of a user interface depicting the results of a stabilization test in accordance with the disclosed embodiments.

FIG. 10 is a diagram of a user interface 1000 depicting the results of a stabilization test in accordance with the disclosed embodiments. The stabilization test is performed to verify the stability of the protection element under injection of current values for which the differential protection should not operate. As part of the stabilization check, a meter test is performed to verify that the local and remote relays read the values injected in magnitude and phase angles. Additionally, the differential currents should have their minimum value, and the restraining current should be at its maximum during the stabilization test. During the stabilization test, the values for the report can be obtained directly at the local relay.

Figure 11A:
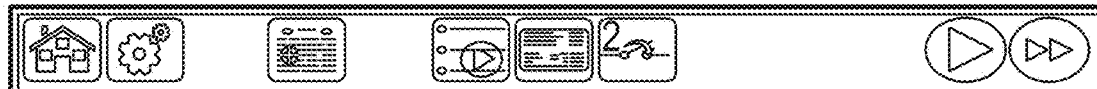
FIG. 11A and FIG. 11B are diagrams of a user interface depicting the results of a pickup test in accordance with the disclosed embodiments.
Figure 11A:
Figure 11B:
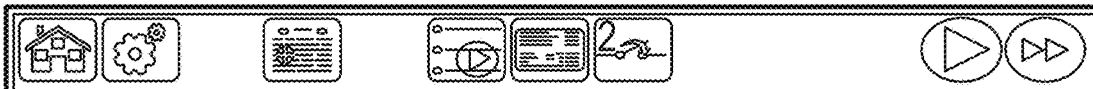
Figure 11B:

FIG. 11A and FIG. 11B are diagrams of a user interface depicting the results of a pickup test in accordance with the disclosed embodiments. FIG. 11A illustrates the results of a pickup test on a local relay. FIG. 11B illustrates the results of a pickup test on a remote relay. A pickup test is performed both on the local and remote relays to verify that the relay will operate (or "pick up") at its designated settings (e.g., minimum operation value) when an abnormal condition, like an overload or fault, occurs.

FIG. 12A and FIG. 12B are diagrams of a user interface depicting the results of a relay timing test in accordance with the disclosed embodiments. FIG. 12A illustrates the results of a relay timing test on a local relay. FIG. 12B illustrates the results of a relay timing test on a remote relay. Timing tests are performed for both the local and remote relays to verify the operation time of the relays on both ends of the line. The trip time should have no intentional time delay for a typical line differential application.

The characteristic is tested using two different approaches: search and shot tests. The characteristic shot test checks whether the relay correctly discriminates between fault and no-fault conditions based on the established characteristic curve that defines how much differential current is needed to trigger a trip at different current levels. The test simulates various operating conditions to determine how the relay responds at different current levels referred to as shot points because they represent specific points on the characteristic curve. A characteristic search test systematically explores how the relay responds to varying levels of differential and restraint currents to ensure that it operates according to its defined characteristic. In contrast to the shot test which checks specific point, the characteristic search test sweeps across a range of differential and restraint currents, gradually increasing or decreasing the currents, to fully map how the relay responds across its entire characteristic curve. This provides a more complete view of the relay's behavior.

Figure 13:
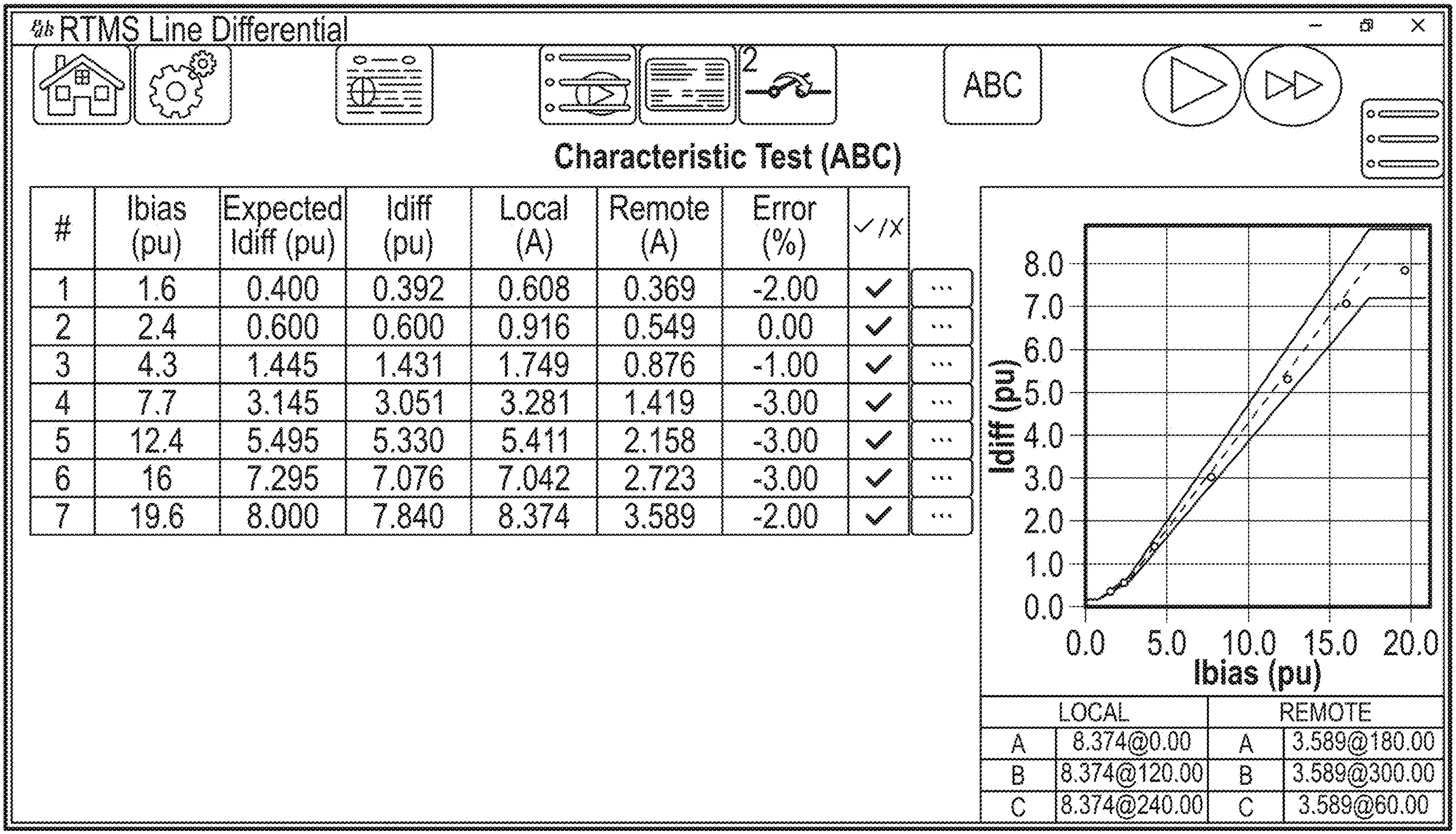
FIG. 13 is a diagram of a user interface depicting a characteristic search test for a percent differential element in accordance with the disclosed embodiments.
Figure 14:
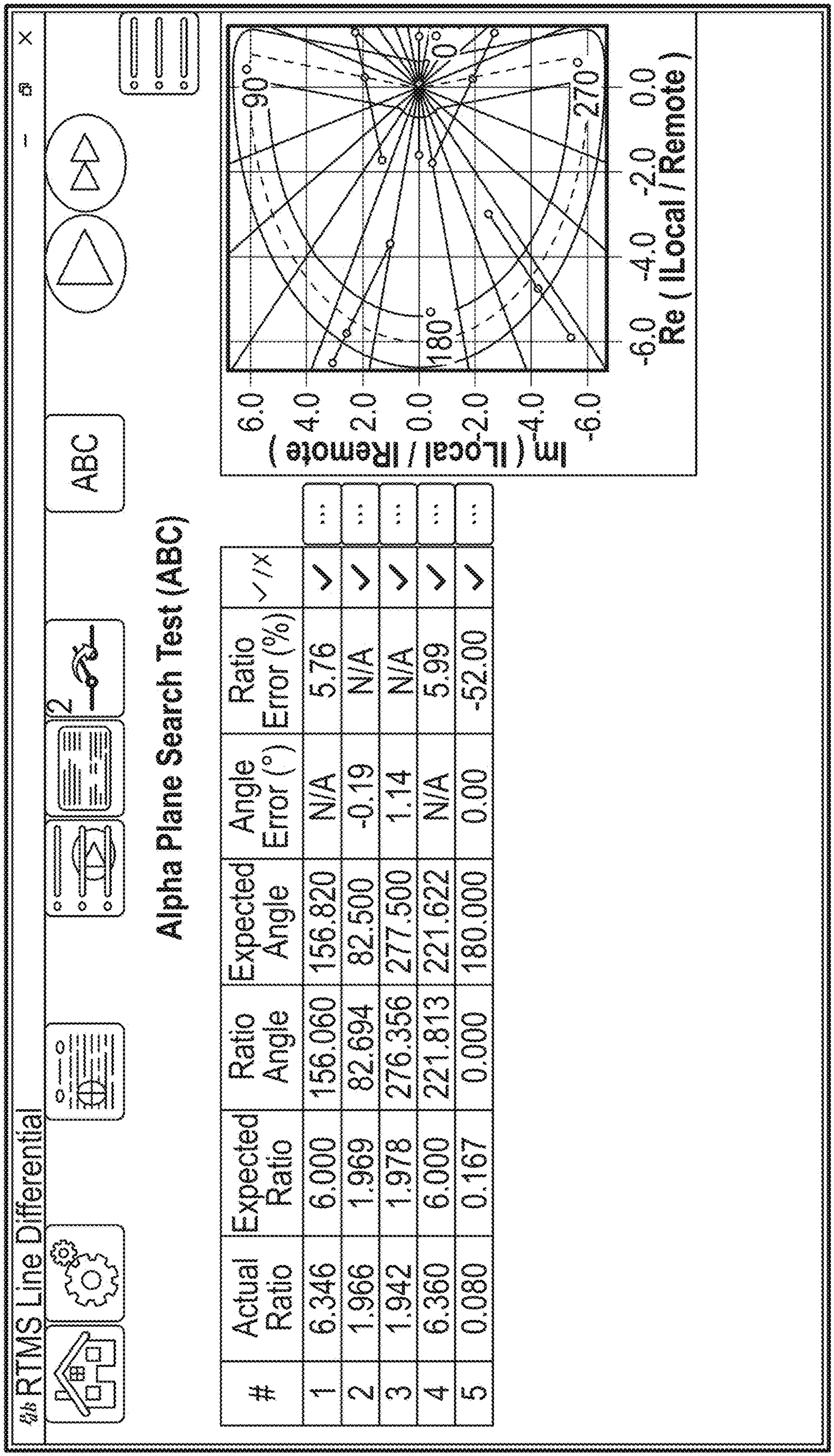
FIG. 14 is a diagram of a user interface depicting a characteristic search test for an alpha plane element in accordance with the disclosed embodiments.

FIG. 13 is a diagram of a user interface depicting a characteristic search test for a percent differential element in accordance with the disclosed embodiments. FIG. 14 is a diagram of a user interface depicting a characteristic search test for an alpha plane element in accordance with the disclosed embodiments. The characteristic search test defines the boundary between the no-operate and operate zones. It runs tests outside the trip zone, increasing the differential current while keeping the restrain current constant.

Figure 15:
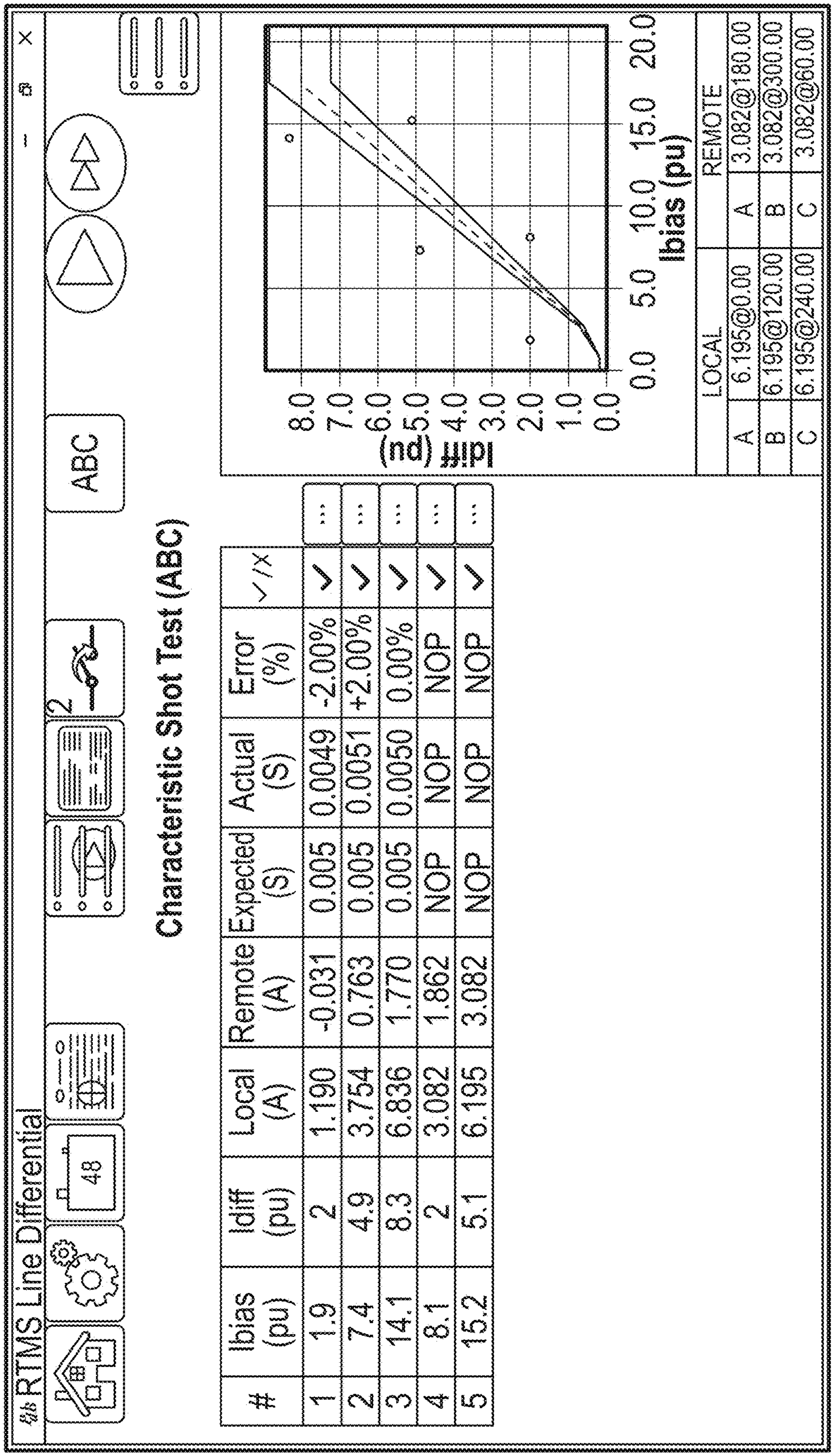
FIG. 15 is a diagram of a user interface depicting a characteristic shot test for a percent differential element in accordance with the disclosed embodiments.
Figure 16:
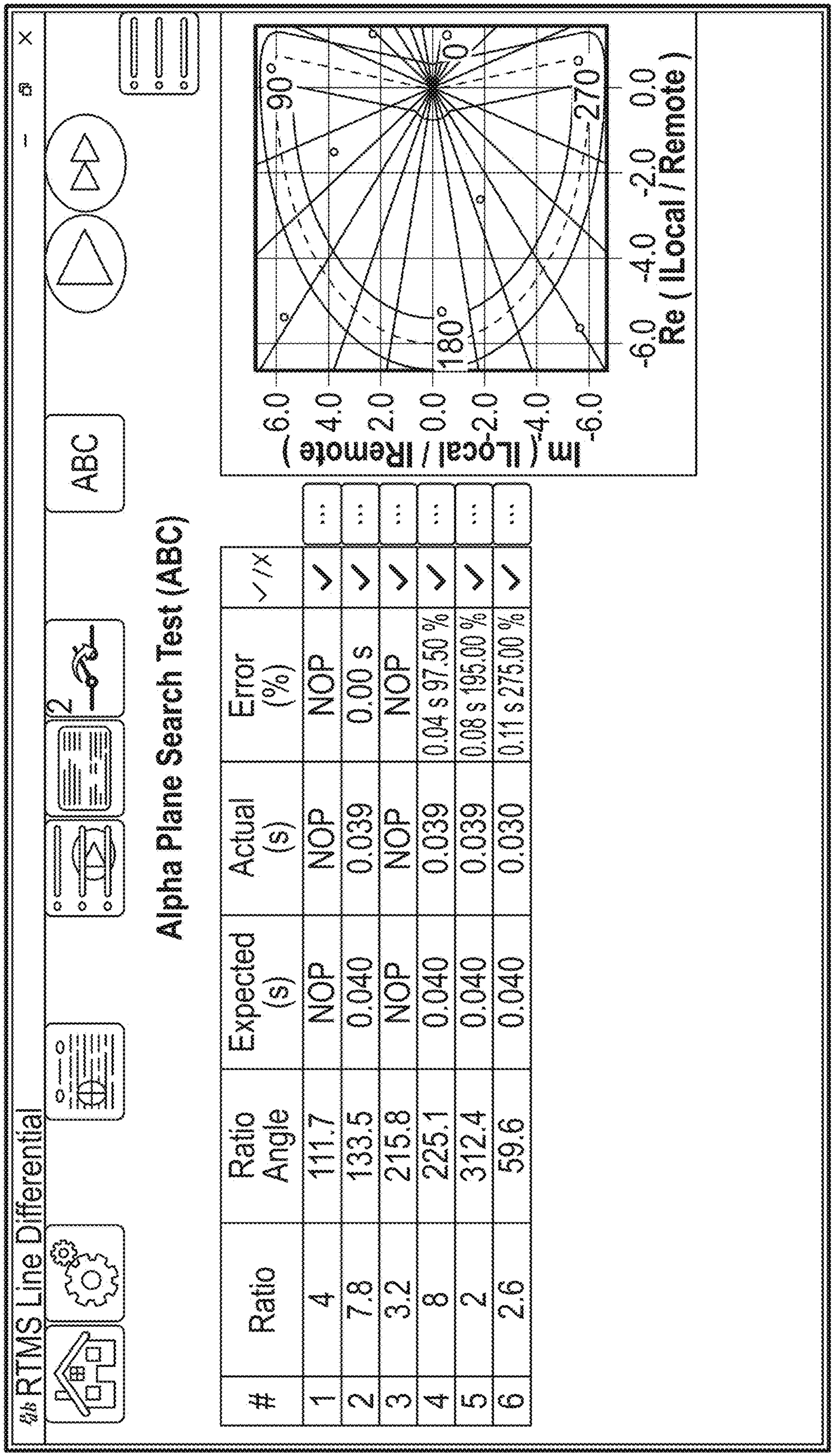
FIG. 16 is a diagram of a user interface depicting a characteristic shot test for an alpha plane element in accordance with the disclosed embodiments.

FIG. 15 is a diagram of a user interface depicting a characteristic shot test for a percent differential element in accordance with the disclosed embodiments. FIG. 16 is a diagram of a user interface depicting a characteristic shot test for an alpha plane element in accordance with the disclosed embodiments. The alpha plane shot test is used to validate correct operation of the relay for internal faults (when the ratio moves into the trip region) and may also check security of the relay for external faults (when the ratio stays in the restraint region). In an embodiment, a protection engineer configures line parameters for performing an alpha plane shot test. The shot test injects several faults inside or outside the operation zone for which the relay must operate or restrain. A protection engineer can define as many tests as required by simply clicking on the place in the plane where the faults must be injected.

Figure 17:
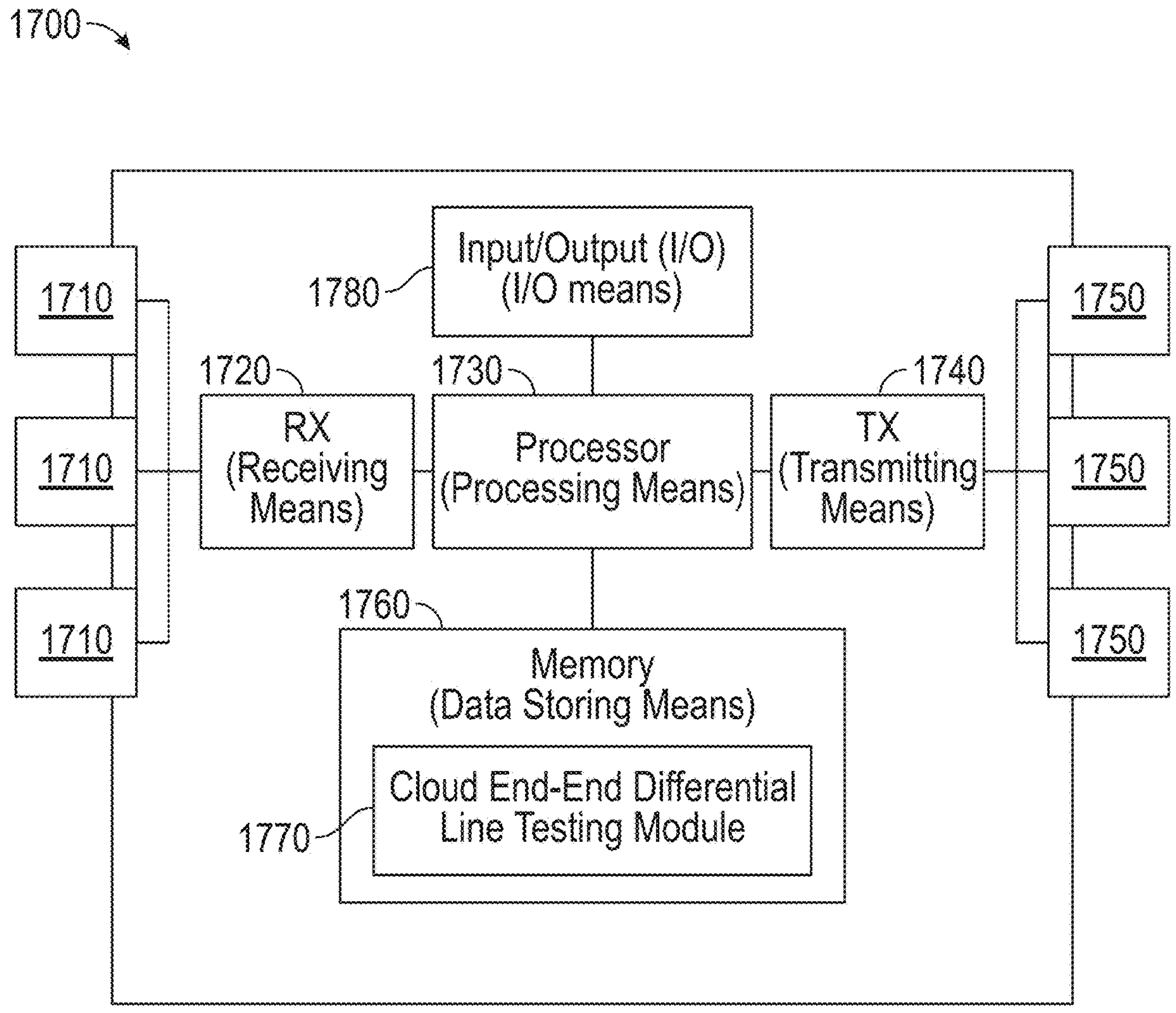
FIG. 17 is a diagram illustrating an apparatus according to an embodiment of the present disclosure.

FIG. 17 is a diagram illustrating an apparatus 1700 according to an embodiment of the present disclosure. The apparatus 1700 can be used to implement embodiments of the present disclosure such as, but not limited to, the local PC 602, the remote PC 652, or the server 620 as described in FIG. 6B. The apparatus 1700 includes input/output (I/O) 1780 or I/O means, receiver units (RX) 1720 or receiving means, and transmitter units (TX) 1740 or transmitting means. In an embodiment, the RX 1720 is a receiver of transceiver that is configured to receive data via ingress ports 1710. 17In an embodiment, the TX 1740 or is a transmitter of the of transceiver and is configured to transmit or send data via data egress ports 1750. In an embodiment, the I/O 1780 is configured to manage (receive/output) data between components of the apparatus 1700 such as a central processing unit (CPU) and external devices or peripherals (e.g., keyboard, mouse, display, etc.) connected to the apparatus 1700.

The apparatus 1700 includes a memory 1760 or data storing means for storing the instructions and various data. The memory 1760 can be any type of, or combination of, memory components capable of storing data and/or instructions. For example, the memory 1760 can include volatile and/or non-volatile memory such as read-only memory (ROM), random access memory (RAM), ternary content-addressable memory (TCAM), and/or static random-access memory (SRAM). The memory 1760 can also include one or more disks, tape drives, and solid-state drives. In some embodiments, the memory 1760 can be used as an over-flow data storage device to store programs when such programs are selected for execution, and to store instructions and data that are read during program execution.

The apparatus 1700 has one or more processors 1730 or other processing means (e.g., a CPU) to process instructions. The one or more processors 1730 may be implemented as one or more CPU chips, cores (e.g., as a multi-core processor), field-programmable gate arrays (FPGAs), application specific integrated circuits (ASICs), and digital signal processors (DSPs). The one or more processors 1730 are communicatively coupled via a system bus with the I/O means 1780, ingress ports 1710, RX 1720, TX 1740, egress ports 1750, and memory 1760. The one or more processors 1730 can be configured to execute instructions stored in the memory 1760. Thus, the one or more processors 1730 provide a means for performing any computational, comparison, determination, initiation, configuration, or any other action corresponding to the claims when the appropriate instruction is executed by the processor. In some embodiments, the memory 1760 can be memory that is integrated with the processor 1730.

In one embodiment, the memory 1760 stores a cloud end-end differential line testing module 1770. The cloud end-end differential line testing module 1770 includes data, executable instructions, and/or one more sub-modules for implementing the disclosed embodiments. Thus, the inclusion of the cloud end-end differential line testing module 1770 substantially improves the functionality of the apparatus 1700.

The disclosed embodiments offer several advantages. By centralizing control at one end of the line, the end-to-end line differential testing process is streamline and the need for highly trained personnel is significantly reduced. Consequently, the training requirements and costs associated with the test are lower. Centralized control also enhances the test's manageability, allowing for seamless repetition and, thus, enhancing the repeatability of results. Unlike traditional methods limited to individual trip tests, this approach allows the user to validate the entire differential characteristic, further amplifying its appeal. Its versatility extends to regression testing, type testing, and commissioning testing, where it proves to be an excellent solution. Additionally, the method improves reporting capabilities. With automated reporting, the results remain untouched and incorruptible, providing a more reliable and trustworthy tool for analysis and evaluation.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A cloud-based line differential relay protection testing method, the method comprising:

establishing a first connection to a first relay test system, wherein the first relay test system is located at a first location and comprises a first relay test unit connected to a first relay that is connected to a transmission line at the first location;

establishing a second connection to a second relay test system, wherein the second relay test system is located at a second location and comprises a second relay test unit connected to a second relay that is connected to the transmission line at the second location;

creating a daisy-chain connection between the first relay test system and the second relay test system for exchanging messages between the first relay test system and the second relay test system;

receiving, from the first relay test system, a line differential relay protection test command comprising test parameter values;

sending, to the second relay test system, the line differential relay protection test command;

receiving, from the second relay test system, a result of a line differential relay protection test performed on the transmission line based on the line differential relay protection test command; and sending, to the first relay test system, the result of the line differential relay protection test.

2. The method of claim 1, further comprising:

receiving, from the first relay test system, first authentication information;

receiving, from the second relay test system, second authentication information; and authenticating, prior to creating the daisy-chain connection, the first relay test system and the second relay test system based on the first authentication information and the second authentication information.

3. The method of claim 2, wherein authenticating the first relay test system and the second relay test system comprises determining that the first authentication information and the second authentication information comprises a matching password.

4. The method of claim 1, wherein the second relay test system is a remote relay test system, and wherein the second connection is established prior to the first connection.

5. The method of claim 1, further comprising terminating the daisy-chain connection in response to receiving a termination request from either the first relay test system or the second relay test system.

6. A cloud-based line differential relay testing method, the method comprising:

establishing, by a local relay test system, communication with a server, wherein the local relay test system comprises a local relay test unit connected to a local relay of a transmission line;

sending, to the server, authentication information of the local relay test system;

providing a user interface for enabling the local relay test system to initiate a sequence of line differential relay protection tests on both the local relay and a remote relay;

receiving line differential relay protection test parameter values for performing a sequence of line differential relay protection tests on the local relay and the remote relay;

receiving a command to perform the sequence of differential relay protection tests based on the line differential relay protection test parameter values;

sending, to a remote relay test system by way of the server, the command for performing the sequence of line differential relay protection tests based on the line differential relay protection test parameter values; and performing, by the local relay test system, the sequence of line differential relay protection tests based on the line differential relay protection test parameter values.

7. The method of claim 6, further comprising receiving, from the remote relay test system by way of the server, results of the sequence of line differential relay protection tests performed by the remote relay test system.

8. The method of claim 6, further comprising obtaining a time reference signal.

9. The method of claim 8, wherein the line differential relay protection test parameter values indicates a start time based on the time reference signal.

10. The method of claim 9, wherein performing, by the local relay test system, the sequence of line differential relay protection tests comprises initiating, simultaneously with the remote relay test system, the sequence of line differential relay protection tests at the start time.

11. The method of claim 6, wherein sending, to the remote relay test system by way of the server, the command comprises sending the command to a port of the server designated for sending messages to the remote relay test system.

12. The method of claim 6, wherein the sequence of line differential relay protection tests simulates prefault and fault conditions.

13. The method of claim 6, wherein performing the sequence of line differential relay protection tests comprises sequentially performing, without user-interaction, the sequence of line differential relay protection tests based on the line differential relay protection test parameter values.

14. The method of claim 6, wherein the sequence of line differential relay protection tests comprises a stabilization test, a pickup test, a timing test, and a characteristic test.

15. The method of claim 14, wherein the characteristic test comprises a percent differential search test, a percent differential shot test, an alpha plane search test, and an alpha plane shot test.

16. The method of claim 6, further comprising configuring the local relay test system to switch from the local relay test system to the remote relay test system.

17. A cloud-based line differential relay testing method, the method comprising:

establishing, by a remote relay test system, communication with a server, wherein the remote relay test system comprises a remote relay test unit connected to a remote relay of a transmission line;

sending, to the server, authentication information of the remote relay test system;

receiving, from a local relay test system by way of the server, a command to perform a sequence of line differential relay protection tests, wherein the command comprises line differential relay test parameter values for performing the sequence of differential relay protection tests relay;

performing, by the local relay test system, the sequence of line differential relay protection tests based on the line differential relay test parameter values; and sending, to local relay test system by way of the server, a result of the sequence of line differential relay protection tests.

18. The method of claim 17, further comprising:

obtaining a time based on a timing signal;

obtaining a start time from the line differential relay test parameter values; and synchronizing performing the sequence of line differential relay protection tests with the local relay test system based on the time and the start time.

19. The method of claim 17, wherein performing the sequence of line differential relay protection tests comprises sequentially performing, without user-interaction, the sequence of line differential relay protection tests based on the line differential relay test parameter values, and wherein the sequence of line differential relay protection tests sequence of tests comprises a stabilization test, a pickup test, a timing test, and a characteristic test.

20. The method of claim 19, wherein the characteristic test comprises a percent differential search test, a percent differential shot test, an alpha plane search test, and an alpha plane shot test.

* * * * *